United States Patent
Sato et al.

(10) Patent No.: US 11,280,024 B2
(45) Date of Patent: Mar. 22, 2022

(54) METHOD FOR PRODUCING A GROUP III NITRIDE SEMICONDUCTOR BY CONTROLLING THE OXYGEN CONCENTRATION OF THE FURNACE INTERNAL ATMOSPHERE

(71) Applicant: TOYODA GOSEI CO., LTD., Kiyosu (JP)

(72) Inventors: Takayuki Sato, Kiyosu (JP); Miki Moriyama, Kiyosu (JP); Shiro Yamazaki, Kiyosu (JP); Yasuhide Yakushi, Kiyosu (JP)

(73) Assignee: TOYODA GOSEI CO., LTD., Kiyosu (JP)

( * ) Notice: Subject to any disclaimer, the term of this patent is extended or adjusted under 35 U.S.C. 154(b) by 0 days.

(21) Appl. No.: 16/814,758

(22) Filed: Mar. 10, 2020

(65) Prior Publication Data

US 2020/0299857 A1   Sep. 24, 2020

(30) Foreign Application Priority Data

Mar. 18, 2019  (JP) .............................. JP2019-050287
Mar. 30, 2019  (JP) .............................. JP2019-069498
Mar. 30, 2019  (JP) .............................. JP2019-069511

(51) Int. Cl.
  *C30B 19/02* (2006.01)
  *C30B 29/40* (2006.01)

(52) U.S. Cl.
  CPC ............ *C30B 19/02* (2013.01); *C30B 29/406* (2013.01)

(58) Field of Classification Search
  CPC .... C30B 9/00; C30B 9/04; C30B 9/08; C30B 9/12; C30B 19/00; C30B 19/02;
  (Continued)

(56) References Cited

U.S. PATENT DOCUMENTS 10,202,710 B2    2/2019  Mori et al.
2005/0098090 A1* 5/2005  Hirota ................... C30B 29/406
                                                                 117/2
(Continued)

FOREIGN PATENT DOCUMENTS

JP  2005-298269 A  10/2005
JP  2008-254999 A  10/2008
(Continued)

OTHER PUBLICATIONS

Imanishi, Masayuki et al."Promotion of lateral growth of GaN crystals on point seeds by extraction of substrates from melt in the Na-flux method" Applied Physics Express vol. 12, 045508 (2019).

*Primary Examiner* — Kenneth A Bratland, Jr.
(74) *Attorney, Agent, or Firm* — McGinn IP Law Group, PLLC

(57) ABSTRACT

The present invention suppresses anomalous growth of a Group III nitride semiconductor at the periphery of a seed substrate. The invention is directed to a method for producing a Group III nitride semiconductor including feeding a nitrogen-containing gas into a molten mixture of a Group III metal and a flux placed in a furnace, to thereby grow a Group III nitride semiconductor on a seed substrate. The oxygen concentration of the furnace internal atmosphere is elevated after the growth initiation temperature of the Group III nitride semiconductor has been achieved. In a period from the initiation of the growth to a certain timing, the oxygen concentration of the furnace internal atmosphere is controlled to 0.02 ppm or less, and thereafter, to greater than 0.02 ppm and 0.1 ppm or less.

5 Claims, 12 Drawing Sheets

(58) Field of Classification Search
CPC ......... C30B 19/08; C30B 19/10; C30B 29/00; C30B 29/10; C30B 29/40; C30B 29/403; C30B 29/406
USPC .......... 117/11, 54, 56, 64–67, 73–74, 77–80, 117/937, 952
See application file for complete search history.

(56) References Cited

U.S. PATENT DOCUMENTS

| | | | |
|---|---|---|---|
| 2007/0296061 A1 | 12/2007 | Sasaki et al. | |
| 2009/0106959 A1* | 4/2009 | Yamazaki | C30B 29/403 29/25.01 |
| 2010/0078606 A1* | 4/2010 | Yamada | C30B 29/406 252/521.5 |
| 2016/0153120 A1* | 6/2016 | Hashimoto | C30B 25/02 428/220 |
| 2017/0073840 A1* | 3/2017 | Mori | H01L 21/02581 |
| 2018/0038010 A1 | 2/2018 | Mori et al. | |

FOREIGN PATENT DOCUMENTS

| | | |
|---|---|---|
| JP | 4915563 B2 | 4/2012 |
| JP | 2016-160151 A | 9/2016 |
| JP | 6019542 B2 | 11/2016 |

* cited by examiner

S1: From initiation of growth to a certain timing, oxygen concentration of furnace interanl atmosphere is controlled to ≦ 0.02 ppm S2: Then, oxygen concentration of furnace internal atmosphere is controlled to > 0.02 ppm and ≦ 0.1 ppm.

METHOD FOR PRODUCING A GROUP III NITRIDE SEMICONDUCTOR BY CONTROLLING THE OXYGEN CONCENTRATION OF THE FURNACE INTERNAL ATMOSPHERE

BACKGROUND OF THE INVENTION

Field of the Invention

The present invention relates to a method for producing a Group III nitride semiconductor through a flux method.

Background Art

A flux method is a known technique for the crystal growth of a Group III nitride semiconductor, in which nitrogen is dissolved in a molten mixture of an alkali metal and a Group III element (e.g., Ga), to thereby achieve epitaxial growth of a Group III nitride semiconductor in the liquid phase. Generally, sodium (Na) is used as the alkali metal. When Na is used as a flux, the technique is called an Na flux method.

Japanese Patent Application Laid-Open (kokai) No. 2016-160151 discloses that oxygen is readily incorporated into a Group III nitride semiconductor crystal which is grown through an Na flux method. Particularly in the case of the 3-dimensional growth mode, oxygen intake increases.

In the production of a Group III nitride semiconductor crystal through a flux method disclosed in Japanese Patent Application Laid-Open (kokai) No. 2016-160151, the oxygen atom concentration in the vicinity of a main face of the crystal is controlled to $1 \times 10^{17}/cm^3$ or less. As a result, even in the case where a thick layer of a Group III nitride semiconductor crystal is formed through, for example, hydride vapor phase epitaxy (HVPE) on a Group III nitride semiconductor crystal which has been grown through a flux method, warpage and cracks of a substrate, which would otherwise be caused by lattice distortion due to oxygen atoms, can be suppressed.

An example of a seed substrate is a template substrate composed of a sapphire substrate or the like and a gallium nitride layer (GaN layer) grown on the substrate through metalorganic chemical vapor deposition (MOCVD). In a specific procedure, a seed substrate, a Group III metal (e.g., Ga), and Na are placed in a crucible, and the crucible is heated in a reaction chamber. Pressurized nitrogen is fed into the chamber, to thereby yield a melt containing Ga and Na. Then, while the temperature and pressure in the chamber are controlled, a single crystal of a Group III nitride semiconductor (e.g., GaN) is grown on a seed substrate placed in the melt.

As disclosed in Japanese Patent Application Laid-Open (kokai) No. 2008-254999, the purity of sodium employed in the flux method must be enhanced. For preventing oxidation of the surface of Na liquid, an Na purifying apparatus and a glovebox, both being isolated from atmosphere, are employed. Also, a surface oxide layer of Na is scraped off.

In crystal growth of a Group III nitride semiconductor through the flux method, occurrence of anomalous growth at the periphery of the seed substrate is problematic. The concept "anomalous growth" refers to failure to achieve crystal growth of a Group III nitride semiconductor on the seed substrate and growth of anomalous grains (i.e., crystal grains greater in size than normally grown grains).

Another problem is occurrence of warpage in the seed substrate, and the degree of warpage tends to vary between product lots. Such warpage is caused by slight lattice mismatch between the template substrate (a GaN crystal) grown through vapor phase growth and the GaN crystal grown through the flux method. In the flux method, oxygen attributed to oxidized sodium is readily incorporated into crystals during growth, and the amount of oxygen incorporation varies depending on the mode of growth. The oxygen profile in the grown crystal determines generation of lattice mismatch.

Thus, when the seed substrate has warpage, fracture and cracks of the grown GaN single crystal occur, and the crystallinity thereof is impaired. Both cases are problematic. In the case where a grown semiconductor single crystal having warpage is used as a substrate for another use, the surface of the substrate is flattened though polishing. However, the angle (off angle) formed by the normal of the polished surface of the substrate and the crystal growth axis (e.g., c axis) varies on the substrate surface, thereby failing to ensure uniformity. As a result, the crystal orientation along the normal of any of the semiconductor layers of a device grown on the substrate fails to have uniformity. This leads to lack of uniformity in device characteristics obtained from a single wafer. Therefore, occurrence of warpage of a semiconductor single crystal grown through a flux method must be suppressed.

Also, when sodium is slightly oxidized or contains a large amount of impurities, miscellaneous crystals tend to generate in a crucible for which a semiconductor single crystal is grown. Such miscellaneous crystals adversely affect the growth of a semiconductor single crystal, impair the crystallinity of the semiconductor single crystal, and reduce the yield of the semiconductor single crystal.

SUMMARY OF THE INVENTION

The present invention has been conceived to solve the problems involved in the aforementioned conventional techniques. Thus, an object of the present invention is to suppress anomalous growth of a Group III nitride semiconductor at the periphery of a seed substrate.

Another object of the invention is to suppress at least one of occurrence of warpage of a Group III nitride semiconductor single crystal and generation of miscellaneous crystals.

Yet another object of the invention is to suppress at least one of occurrence of warpage of a Group III nitride semiconductor single crystal and generation of miscellaneous crystals, through controlling the amount of oxygen incorporated into an Na material.

These objects are to be attained by a relevant aspect of the present invention, and no single aspect necessarily attains all the objects.

In view of the foregoing, the present inventors have carried out extensive studies, and have found that anomalous growth at the periphery of the seed substrate can be suppressed by controlling the oxygen concentration of an atmosphere for the growth of a Group III nitride semiconductor during the growth. A first aspect of the present invention has been accomplished on the basis of this finding.

According to a technical feature of the first aspect of the present invention, in the Group III nitride semiconductor production method which includes feeding a nitrogen-containing gas into a molten mixture of a Group III metal and a flux placed in a furnace, to thereby grow a Group III nitride semiconductor on a seed substrate, the oxygen concentration of the atmosphere inside the furnace (hereinafter may be referred to as "furnace internal atmosphere") is elevated after the growth initiation temperature of the Group III nitride semiconductor has been achieved.

In the first aspect of the present invention, the following mode may be employed. The elevation of the oxygen concentration may be in a gradual manner or a stepwise manner at the growth initiation temperature or higher. Preferably, the oxygen concentration of the furnace internal atmosphere before achieving the growth initiation temperature is controlled to 0.02 ppm or less and greater than 0 ppm. In the period from the initiation of the growth of the Group III nitride semiconductor to a certain timing, desirably, the oxygen concentration of the furnace internal atmosphere is controlled to 0.02 ppm or less and greater than 0 ppm, and thereafter, to greater than 0.02 ppm and 0.1 ppm or less. The above period is preferably adjusted to 5 to 15 hours after the initiation of the growth of the Group III nitride semiconductor. When the period falls within the above range, anomalous growth at the periphery of the seed substrate can be more effectively suppressed. Also, the oxygen concentration of the furnace internal atmosphere may be controlled by means of the oxygen concentration of the nitrogen-containing gas which is fed to the molten mixture. Further, the oxygen concentration of the furnace internal atmosphere may be regulated by means of the oxygen concentration of the atmosphere outside the furnace (hereinafter may be referred to as "furnace external atmosphere").

In the above description, the term "oxygen concentration" is on a volume basis. Also, the timing of initiating the growth of the Group III nitride semiconductor refers to that the timing at which the growth temperature and pressure are achieved through heating and pressurizing. The term "furnace internal atmosphere" refers to the atmosphere of the chamber of the furnace in which the molten mixture is placed; more specifically to the gas which is in contact with the molten mixture. The oxygen concentration of the furnace internal atmosphere is controlled through, for example, the following procedures. In one procedure, the oxygen concentration of the furnace internal atmosphere is regulated by the oxygen concentration of the nitrogen-containing gas fed to the molten mixture, whereby the oxygen concentration of the furnace internal atmosphere can be directly controlled. In another procedure, the oxygen concentration of the furnace internal atmosphere is regulated by that of the furnace external atmosphere. In the case where the inside and the outside of the furnace are not definitely isolated from each other due to the structural feature of the crystal growth apparatus, the furnace external atmosphere may have slight impact on the furnace internal atmosphere. However, through employment of the effect, the oxygen concentration of the furnace internal atmosphere may be indirectly controlled. At this time, the furnace is preferably preheated (baked) before the growth to prevent gas from being generated from the furnace. The oxygen concentration of the furnace internal atmosphere may also be controlled by preheating.

A second aspect of the present invention is directed to a Group III nitride semiconductor production method which includes feeding a nitrogen-containing gas into a molten mixture of a Group III metal and a flux placed in a furnace, to thereby grow a Group III nitride semiconductor on a seed substrate. A technical feature of the second aspect resides in the Group III nitride semiconductor being grown on the seed substrate, while controlling the surface modification weight ratio, which is defined as the ratio of the weight of Na including a portion surface-modified through oxidation or hydroxidation to the weight of Na when the surface thereof has no surface-modified portion as a reference weight, with Na serving as the flux.

In the second aspect of the present invention, the following mode may be employed. The surface modification weight ratio (=(reference weight+weight increase by surface modification)/reference weight) is preferably controlled to 1.000002 to 1.001. That is, the ratio of weight increase by surface modification to reference weight (=weight increase by surface modification/reference weight) is preferably controlled to $2 \times 10^{-6}$ to $1 \times 10^{-3}$. The surface modification weight ratio may be adjusted to 1.00002 to 1.0001. That is, the ratio of weight increase by surface modification to reference weight is preferably adjusted to $2 \times 10^{-5}$ to $1 \times 10^{-4}$. When the above conditions are satisfied, generation of miscellaneous crystals can be effectively suppressed. The surface modification weight ratio may be adjusted to 1.000002 to 1.00005. That is, the ratio of weight increase by surface modification to reference weight is preferably adjusted to $2 \times 10^{-6}$ to $5 \times 10^{-5}$. When the condition is satisfied, warpage of the substrate after growth of the target crystal can be effectively prevented.

Alternatively, the surface modification weight ratio may be modified by maintaining Na in a specific environment outside the furnace before its entrance to the furnace. In one possible procedure, Na is maintained for a predetermined period in a sealed container where the oxygen concentration and water content are controlled. In this case, Na absorbs oxygen and water (referring to inclusion of water vapor, in the specification) present in the sealed container to equilibrium, whereby the oxygen concentration and water content of Na attain constant values. Still alternatively, the surface modification weight ratio may be modified by feeding a gas mixture containing at least one of oxygen and water to the furnace. In this case, the oxygen concentration and water content of the specific environment are preferably controlled to ≤0.05 ppm and >0 ppm, respectively. Also, to the specific environment, a gas mixture containing at least one of oxygen and water may be introduced. In a preferred procedure, an Na piece whose surface modification weight ratio has been controlled is cut, and a carbon material is placed on a surface of the cut piece which has undergone no oxidation or hydroxidation, followed by placing the resultant piece in the furnace. Through this process, carbon can be dispersed in molten Na in a more uniform manner.

According to the Group III nitride semiconductor single crystal production method of the second aspect of the present invention, occurrence of warpage of the Group III nitride semiconductor single crystal can be suppressed. Also, the amount of miscellaneous crystals generated can be suppressed. Moreover, reproducibility in quality of the semiconductor single crystal between production batches and production yield are improved.

A third aspect of the present invention is directed to a Group III nitride semiconductor production method which includes feeding a nitrogen-containing gas into a molten mixture of a Group III metal and a flux placed in a furnace, to thereby grow a Group III nitride semiconductor on a seed substrate. A technical feature of the third aspect resides in that at least the oxidation amount of Na serving as the flux is controlled outside the furnace, and the thus-controlled Na is fed into the furnace.

In the third aspect of the present invention, the following mode may be employed. Specifically, molten Na prepared by liquefying Na is circulated through a first state where the temperature is maintained at a first temperature and a second state where the temperature is maintained at a second temperature lower than the first temperature, to thereby remove oxidized Na contained in the molten Na in the second state. The oxidation amount may be regulated by modifying the second temperature. In the third aspect, the second temperature is preferably controlled to 120° C. to 300° C. Circulation of molten Na performed for controlling the oxidation amount and the purity of Na is conducted by means of a circulation apparatus. In one embodiment, the Na circulation apparatus includes a circulation path for converting the Na material to liquid and causing the liquid to flow, and the circulation path includes an Na purity control section maintained at the second temperature and a pipe. In the apparatus of this configuration, the Na circulation path may include an Na-storing section, and the temperatures of the Na-storing section and the pipe may be adjusted to be higher than that of the Na purity control section.

According to the first aspect of the present invention, anomalous crystal growth at the periphery of the seed substrate can be suppressed, whereby a uniform and flat Group III nitride semiconductor layer can be grown on the seed substrate. According to the second and third aspects of the present invention, at least one of occurrence of warpage of the Group III nitride semiconductor single crystal and generation of miscellaneous crystals can be suppressed.

BRIEF DESCRIPTION OF DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Specific embodiments of the present invention are directed to growth of a Group III nitride semiconductor crystal on a seed substrate through a flux method. First, the flux method will be described generally.

1. General Description of Flux Method

The flux method employed in the embodiments of the invention is a technique which includes feeding a nitrogen-containing gas to a molten mixture containing an alkali metal (flux) and a Group III metal (raw material), and dissolving the gas in the molten mixture, to thereby achieve epitaxial growth of a Group III nitride semiconductor in a liquid phase.

The Group III metal, serving as a raw material, is at least one metal selected from among gallium (Ga), aluminum (Al), and indium (In). Through modifying the proportions of the metal elements, the composition of the formed Group III nitride semiconductor can be controlled, and specifically, GaN, AlN, InN, AlGaN, InGaN, AlGaInN, and other semiconductors can be grown. Use of only Ga as a Group III metal is particularly preferred. In other words, the present invention is particularly suitable for the growth of GaN. The alkali metal serving as a flux is generally sodium (Na), but potassium (K) or a mixture of Na and K may also be used. Furthermore, lithium (Li) or an alkaline earth metal may also be added.

To the molten mixture, carbon (C) may also be added. Addition of carbon results in acceleration of crystal growth. A dopant other than C may also be added to the molten mixture, for the purpose of controlling physical properties (e.g., the type conduction and magnetic properties) of the grown Group III nitride semiconductor, promoting crystal growth, suppressing generation of miscellaneous crystals, regulating the growth direction, or the like. For example, germanium (Ge) or the like may be used as an n-type dopant, and magnesium (Mg), zinc (Zn), calcium (Ca), or the like may be used as a p-type dopant. The nitrogen-containing gas is a gas of nitrogen molecules, a gas of a compound including a nitrogen element (e.g., ammonia), or a mixture thereof. The nitrogen-containing gas may be mixed with an inert gas such as a rare gas.

2. Structure of Seed Substrate

In the embodiments, a seed substrate (seed crystal) is placed in the molten mixture, and a Group III nitride semiconductor is grown on the seed substrate. The seed substrate may be placed in the molten mixture before heating or pressurization or after achieving growth temperature and pressure through heating and pressurization. As the seed substrate, a self-standing substrate or a template substrate made of a Group III nitride semiconductor may be used. The self-standing substrate may be formed of a Group III nitride semiconductor having arbitrary compositional proportions such as GaN, AlGaN, or AlN. Generally, a Group III nitride semiconductor having the same composition as that of the Group III nitride semiconductor to be grown through the flux method is used.

Figure 21A:
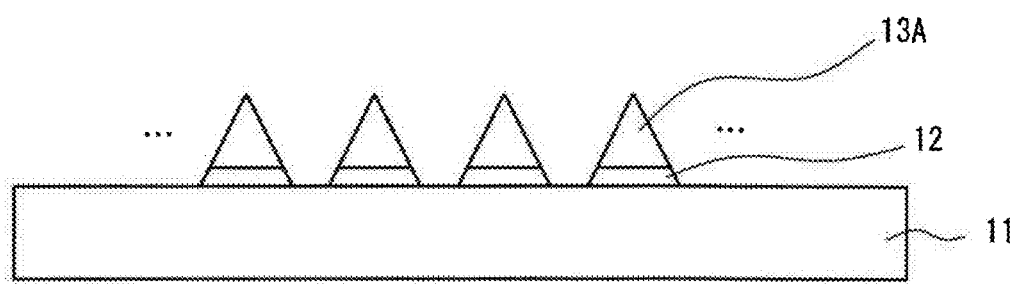
FIG. 21A is a cross-section of another example of the seed substrate.
Figure 21B:
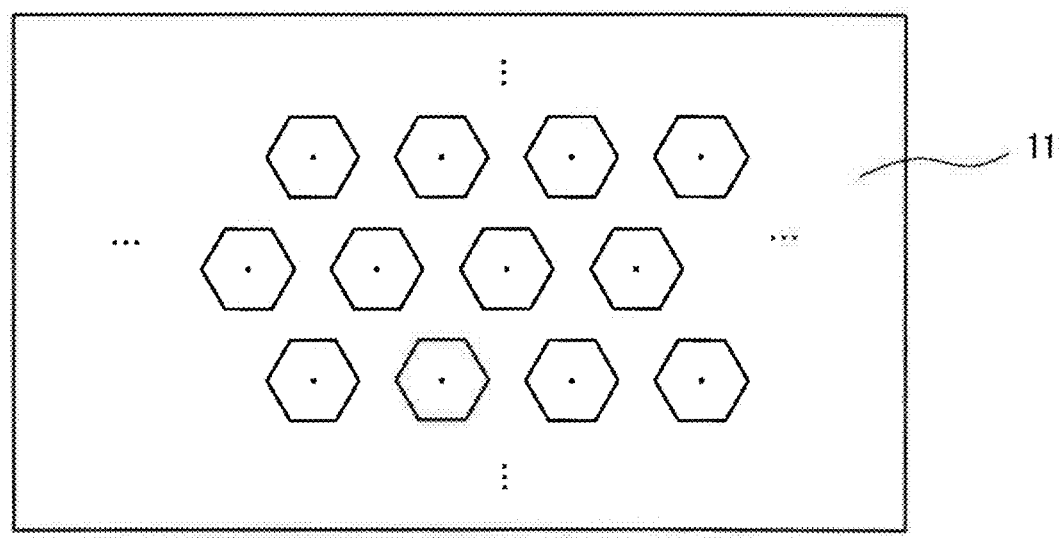
FIG. 21B is a plan view of the example of the seed substrate.

The template substrate is formed of an underlayer substrate, a buffer layer provided on the underlayer substrate, and a Group III nitride semiconductor layer which has a c-plane as a main plane and which is provided on the buffer layer. For example, the template substrate has a structure shown in FIG. 14. Also, as shown in FIGS. 21A and 21B, there may be used a substrate formed of an underlayer substrate on which a plurality of Group III nitride semiconductor columns (e.g., round column, hexagonal prism, hexagonal pyramid, truncated hexagonal pyramid, etc.) pieces are arranged. The underlayer substrate may be formed of any material, so long that it allows a Group III nitride semiconductor to be grown on the substrate. Examples of the material which may be used in the invention include sapphire, ZnO, and spinel. The Group III nitride semiconductor layer provided on the underlayer substrate may be formed of a Group III nitride semiconductor having arbitrary compositional proportions such as GaN, AlGaN, or AlN. Generally, a Group III nitride semiconductor having the same composition as that of the Group III nitride semiconductor to be grown through the flux method is used. The Group III nitride semiconductor layer may be formed through any technique such as MOCVD, HVPE, or MBE. However, from the viewpoints of crystallinity and growth time, MOCVD and HVPE are preferred.

3. Configuration of Crystal Growth Apparatus

In the Group III nitride semiconductor production method according to an embodiment of the present invention, a crystal growth apparatus 1000 having, for example, the following configuration is employed.

Figures 1, 2:
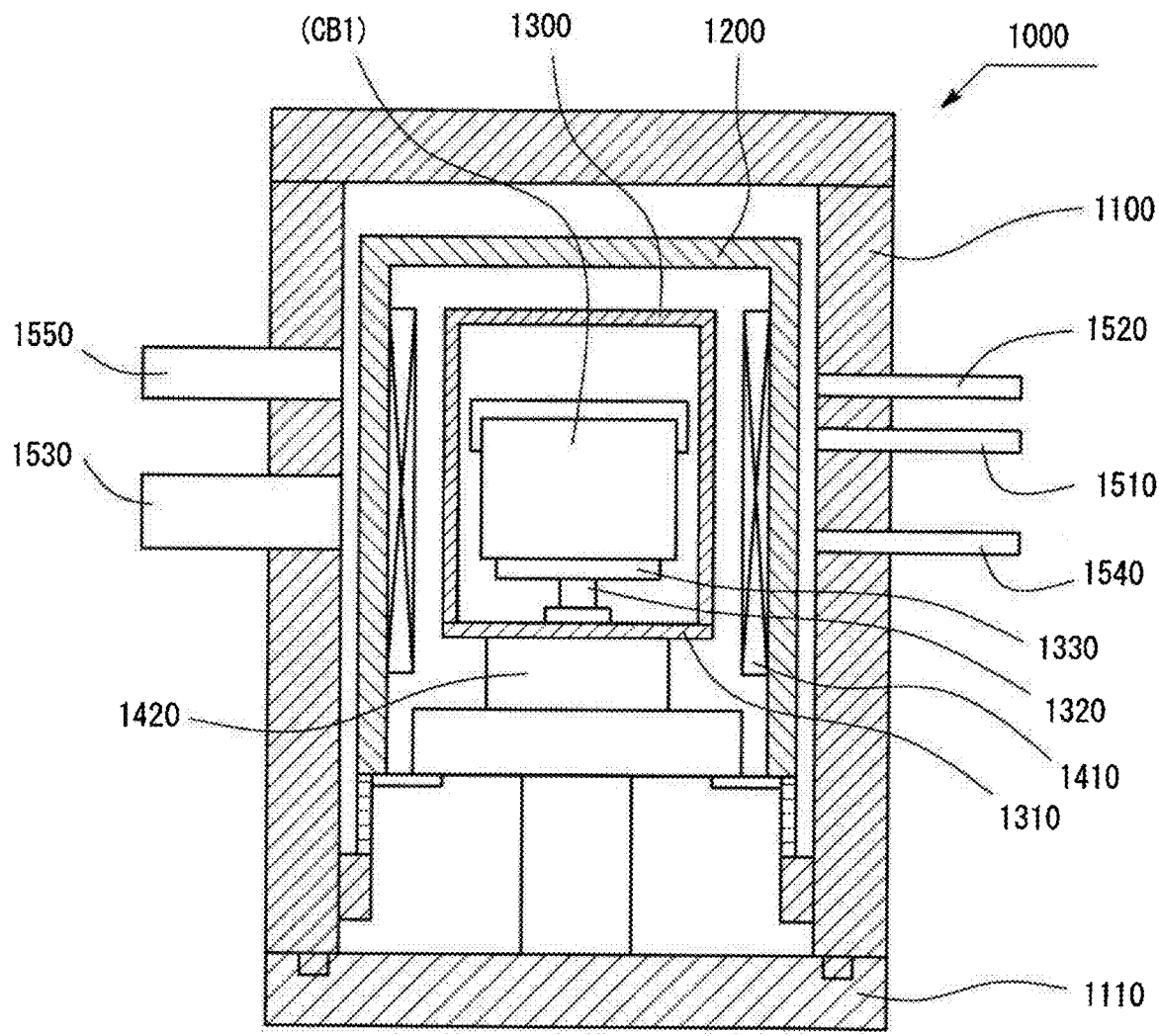
FIG. 1 is a sketch showing the configuration of a crystal growth apparatus according to one embodiment of the present invention.
FIG. 2 is a flow chart showing growth steps of the Group III nitride semiconductor of the first embodiment.

FIG. 1 is a sketch showing the configuration of the crystal growth apparatus 1000. The crystal growth apparatus 1000 is employed for the growth of a Group III nitride semiconductor single crystal on a growth substrate through an Na flux method. As shown in FIG. 1, the crystal growth apparatus 1000 has a pressure vessel 1100, a pressure vessel lid 1110, a middle chamber 1200, a reaction chamber 1300, a reaction chamber lid 1310, a rotation axis 1320, a turn table 1330, a side heater 1410, a lower heater 1420, a gas intake inlet 1510, a gas exhaust outlet 1520, a vacuum exhaust outlet 1530, a measurement ventilation hole 1540, and a Qmass mounting port 1550.

The pressure vessel 1100 serves as a housing of the crystal growth apparatus 1000. The pressure vessel lid 1110 is disposed under the pressure vessel 1100 in an orthogonal direction. The middle chamber 1200 is a chamber disposed inside the pressure vessel 1100. The reaction chamber 1300 is a chamber for accommodating a crucible CB1, in which a semiconductor single crystal is to be grown. The reaction chamber lid 1310 serves as a lid for the reaction chamber 1300. The rotation axis 1320 is adapted to regular rotation and reverse rotation. The rotation axis 1320 receives rotary drive by a motor (not illustrated). The turn table 1330 allows rotation following the rotation axis 1320. The side heater 1410 and the lower heater 1420 are provided for heating the reaction chamber 1300.

The gas intake inlet 1510 is an inlet through which a nitrogen-containing gas is fed into the pressure vessel 1100. The gas exhaust outlet 1520 is an outlet through which a gas inside the pressure vessel 1100 is discharged. The vacuum exhaust outlet 1530 is an outlet for evacuating the pressure vessel 1100. The measurement ventilation hole 1540 is a hole through which a gas inside the pressure vessel 1100 is extracted for assay. On the gas flow downstream side of the ventilation hole 1540, an $O_2$ sensor and a dew point meter are disposed. The Qmass mounting port 1550 is disposed for mounting a Qmass apparatus. The crystal growth apparatus 1000 enables regulation of the temperature and pressure inside the crucible CB1 and rotating the crucible CB1. Thus, in the crucible CB1, a semiconductor single crystal can be grown from a seed crystal under conditions of interest.

First Embodiment

A first embodiment is directed to a method for controlling the oxygen concentration of the furnace internal atmosphere.

In the crystal growth apparatus 1000, the oxygen concentration of the furnace internal atmosphere (i.e., the atmosphere inside the reaction chamber 1300) is controlled by regulating the oxygen concentration of the nitrogen-containing gas fed into the reaction chamber 1300 through the gas intake inlet 1510. In the case where the furnace internal atmosphere and the furnace external atmosphere (the atmosphere outside the pressure vessel 1100) are not definitely isolated from each other due to the structural feature of the crystal growth apparatus 1000, the furnace external atmosphere may have slight impact on the furnace internal atmosphere. On the basis of the phenomenon, the oxygen concentration of the furnace internal atmosphere may be controlled by controlling the oxygen concentration of the furnace external atmosphere. In this case, desirably, an additional chamber (i.e., a lower chamber) which embraces the gap between the pressure vessel 1100 and the pressure vessel lid 1110 is provided, and the oxygen concentration of the atmosphere of the additional chamber is controlled.

1. Group III Nitride Semiconductor Production Method

Next, the Group III nitride semiconductor production method according to the first embodiment will be described, with reference to relevant drawings. Firstly, the furnace internal atmosphere is substituted by inert gas, and the furnace is heated. Thereafter, the furnace is evacuated so as to satisfactorily reduce the out gas component (e.g., oxygen) level. Then, the alkali metal and Group III metal are weighed in a glovebox in which the atmosphere (e.g., oxygen and dew point) is controlled. Subsequently, the seed substrate and the thus-weighed alkali metal and the Group III metal in specific amounts are added to the crucible CB1. If needed, an additional element such as carbon may be further added.

Then, the crucible CB1 to which the raw materials have been added is placed on the turn table 1330 of the reaction chamber 1300, and the reaction chamber 1300 is closed.

Further, the reaction chamber 1300 is confined in the pressure vessel 1100. Thereafter, the reaction chamber 1300 and the pressure vessel 1100 are evacuated, and a nitrogen-containing gas is fed into the reaction chamber 1300 and the pressure vessel 1100. When the pressure reached the crystal growth level, the inside temperature of the furnace is elevated to the crystal growth temperature. For example, the crystal growth temperature is 700° C. to 1,000° C., and the crystal growth pressure is 2 MPa to 10 MPa. In the course of temperature elevation, the alkali metal and the Group III metal in solid form are melted in the crucible CB1, to thereby form a liquid molten mixture.

When the temperature inside the reaction chamber 1300 has reached the crystal growth temperature, the crucible CB1 is preferably rotated. Whereby the molten mixture is stirred, to thereby achieve a uniform mixing state of the molten mixture where the alkali metal concentration and the Group III metal concentration become uniform. When nitrogen is gradually dissolved in the molten mixture to a supersaturated state, growth of a Group III nitride semiconductor on the upper surface of the seed substrate begins. Notably, stirring may be initiated before achieving the crystal growth temperature in the reaction chamber 1300. While the crystal growth temperature and pressure are maintained, a Group III nitride semiconductor crystal is sufficiently grown on the upper surface of the seed substrate 1. Then, the rotation of the crucible CB1 and heating of the reaction chamber 1300 are terminated, whereby the temperature is lowered to room temperature, and the pressure is reduced to normal pressure. At this timing, growth of the Group III nitride semiconductor is terminated.

In the Group III nitride semiconductor production method of the first embodiment, the growth is initiated at the timing where the crystal growth temperature and pressure have been achieved. During the course from the timing of growth initiation to a specific time, the oxygen concentration of the furnace internal atmosphere is controlled to be 0.02 ppm or less (first step, step S1 in FIG. 2). Herein, the term "oxygen concentration" is defined as a volume basis concentration. The concept "furnace internal atmosphere" refers to the atmosphere of the reaction chamber 1300 in which the molten mixture is placed, more specifically to the gas which is in contact with the molten mixture. In order to reduce the oxygen concentration of the furnace internal atmosphere to 0.02 ppm or less, the oxygen concentration of the furnace external atmosphere is preferably reduced to as low a level as possible. In the case where the furnace internal atmosphere and the furnace external atmosphere (the atmosphere outside the pressure vessel 1100) are not definitely isolated from each other due to the structural features of the crystal growth apparatus 1000, oxygen enters the furnace through, for example, the space at the opening/closing port of the furnace, whereby the furnace external atmosphere may have slight impact on the oxygen concentration of the furnace internal atmosphere. When a lower chamber is disposed under the crystal growth apparatus 1000, the atmosphere of the lower chamber is preferably substituted by an inert gas such as nitrogen.

In the first Group III nitride semiconductor growth step, the growth time is preferably set to 5 to 15 hours. Under the conditions, anomalous growth at the periphery of the seed substrate can be more effectively suppressed. The growth time is more preferably 7 to 13 hours, still more preferably 9 to 11 hours. In the first step, the oxygen concentration of the furnace internal atmosphere is not necessarily constant, so long as it is 0.02 ppm or lower. More specifically, the oxygen concentration may be elevated in a continuous or stepwise manner. Notably, a more preferred oxygen concentration of the furnace internal atmosphere in the first step is 0.015 ppm or lower, more preferably 0.01 ppm or lower. Although the oxygen concentration is desirably lower, it is preferably 0.005 ppm or higher, from the viewpoints of ease of control and cost.

Subsequently, after the first step (i.e., from the initiation of the growth of the Group III nitride semiconductor to elapse of a certain time), the oxygen concentration of the furnace internal atmosphere is controlled to >0.02 ppm and to 0.1 ppm or lower (second step, step S2 in FIG. 2). In the second step, the oxygen concentration of the furnace internal atmosphere is not necessarily constant, so long as it is >0.02 ppm and 0.1 ppm or lower. More specifically, the oxygen concentration may be elevated in a continuous or stepwise manner. Alternatively, the oxygen concentration is not necessarily changed in a stepwise manner from the first step to the second step, and it may be continuously changed.

As described above, in the first embodiment, the oxygen concentration of the furnace internal atmosphere during the period of initiation of the growth to a specific time is controlled to 0.02 ppm or lower. Then, the oxygen concentration of the furnace internal atmosphere is controlled to be >0.02 ppm and 0.1 ppm or lower. Through controlling the oxygen concentration in the above manner, anomalous growth at the periphery of the seed substrate can be suppressed, whereby a flat and uniform Group III nitride semiconductor crystal layer can be formed on the seed substrate.

No precise mechanism has been elucidated for suppressing anomalous growth at the periphery of the seed substrate through controlling the oxygen concentration of the furnace internal atmosphere. However, a conceivable mechanism is as follows. In an initial stage of crystal growth, the following reaction is thought to occur in accordance with the oxygen content of the molten mixture.

In the initial stage of crystal growth, when the molten mixture has a lower oxygen content, conceivably, nitrogen which is present in the crucible CB1 in the vicinity of the side wall and which is dissolved in the molten mixture is consumed due to a certain reaction. As a result, a portion of the molten mixture in the vicinity of the side wall of crucible CB1 attains a nitrogen-unsaturated state, and the peripheral portion of the seed substrate undergoes melting back, to thereby cause anomalous growth. In the initial stage of crystal growth, when the molten mixture has an appropriate oxygen concentration, the aforementioned reaction in the vicinity of the side wall of crucible CB1 is thought to be suppressed. Thus, even in the vicinity of the side wall of crucible CB1, a large amount of nitrogen is dissolved. In this case, nitrogen is supersaturated in the molten mixture, to thereby prevent melting back at the periphery of the seed substrate. In the initial stage of crystal growth, when the molten mixture contains an excess amount of oxygen, the surface of the molten mixture is covered with oxide film. The formation of the oxide film is conceivably more localized at the side wall of the crucible CB1 when the crucible CB1 is rotated, as the crucible CB1 rotates. By virtue of the oxide film, the amount of nitrogen dissolved in the molten mixture decreases, and nitrogen is unsaturated in the molten mixture. As a result, melting back occurs at the periphery of the seed substrate, leading to anomalous growth.

According to the first embodiment in which the oxygen concentration is controlled, the oxygen content of the molten mixture in the initial stage of crystal growth is adjusted to a moderate level. As a result, conceivably, melting back at the periphery of the seed substrate is suppressed, and anomalous growth is suppressed.

2. Method for Controlling Oxygen Concentration

One method for controlling the oxygen concentration of the furnace internal atmosphere is to manage the furnace in which the furnace is placed (i.e., furnace external atmosphere). In some structures of the crystal growth apparatus 1000, isolation between the furnace internal atmosphere and the furnace external atmosphere is not completely achieved. In such a case, when the oxygen concentration of the furnace external atmosphere varies, the amount of oxygen migrating into the space of the furnace also varies. Thus, the oxygen concentration of the furnace internal atmosphere varies. On the basis of the phenomenon, the oxygen concentration of the furnace internal atmosphere may be controlled by the oxygen concentration of the furnace external atmosphere.

Another method for controlling the oxygen concentration is modifying the oxygen concentration of the nitrogen-containing gas fed to the furnace (i.e., the gas fed to the reaction chamber 1300). Through this technique, the oxygen concentration of the furnace internal atmosphere can be directly controlled. The oxygen concentration of the gas fed through the gas intake inlet 1510 to the reaction chamber 1300 may be regulated. Alternatively, an additional oxygen intake inlet is attached to the reaction chamber 1300, and the oxygen concentration of the gas flowing through the inlet to the reaction chamber 1300 may be regulated.

With reference to the drawings, the first embodiment will next be described in detail by way of working examples, which should not be construed as limiting the present invention thereto.

Example 1

By use of the crystal growth apparatus 1000, a GaN crystal was grown on a seed substrate in the following manner. Firstly, the atmosphere of the furnace (reaction chamber 1300 and pressure vessel 1100) was substituted by nitrogen gas. The furnace was heated and evacuated, to thereby reduce the amounts of oxygen and water. Through this process, the oxygen concentration of the furnace internal atmosphere was adjusted to 0.02 ppm or lower at the start of growth of a GaN crystal. Subsequently, a crucible CB1 made of alumina was placed in a glovebox, and a seed crystal, Ga (solid), and Na (solid) were placed in the crucible. In order to enhance the growth rate, graphite powder was added to the crucible CB1. A seed substrate formed of a sapphire substrate on which a flat and uniform GaN layer had been provided through MOCVD was used.

Then, the crucible CB1 was transferred to a furnace, and the furnace was tightly closed. Nitrogen was fed to the furnace so as to adjust the internal pressure to 3 MPa. For preventing oxidation of Na in the crucible CB1 in the glovebox and the transfer path, the atmosphere of the lower chamber was controlled, and the crucible CB1 was put in a specific container for its transfer to the furnace. Thereafter, the furnace was heated to the growth temperature (856° C.), whereby growth of a GaN crystal on the seed substrate was started. When the temperature reached the growth temperature, the nitrogen atmosphere of the lower chamber sealing the opening/closing port of the pressure vessel 1100 was substituted by dry air. Thus, air gradually entered from the outside of the furnace to the pressure vessel 1100, and further from the pressure vessel 1100 to the reaction chamber 1300.

Figure 3:
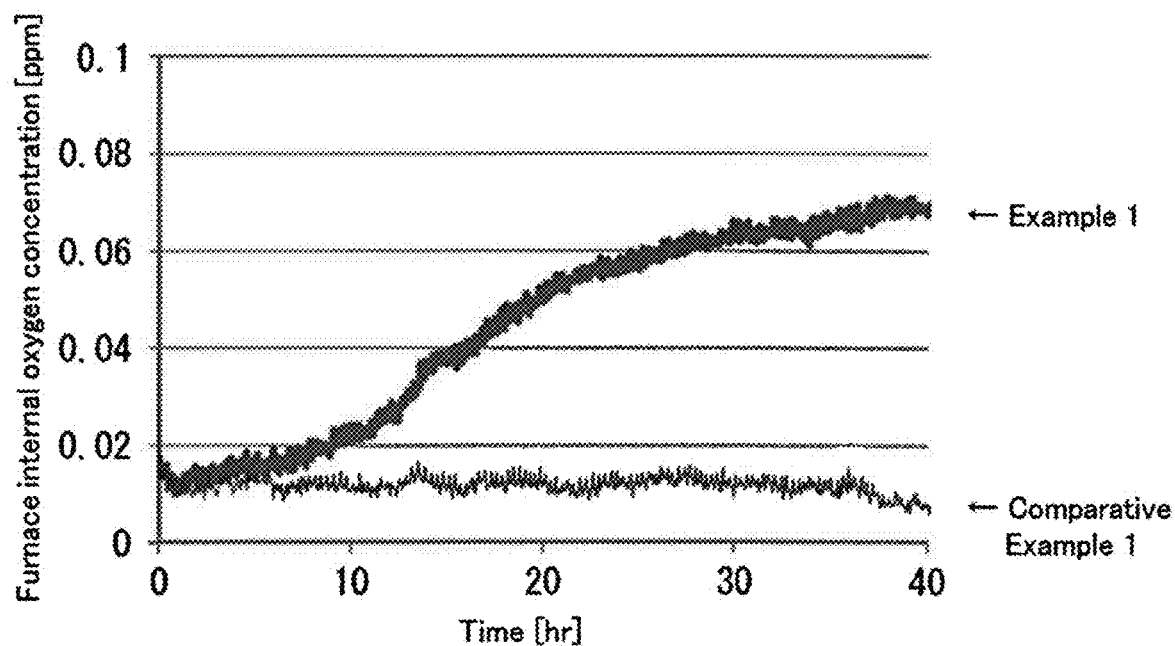
FIG. 3 is a graph showing the relationship between oxygen concentration and growth time in the first embodiment.

FIG. 3 is a graph showing the relationship between the growth time (time after achieving to growth temperature) and the oxygen concentration of the furnace internal atmosphere. The oxygen concentration of the gas discharged from the reaction chamber 1300 through the gas exhaust outlet 1520 was measured, and the obtained measurement was employed as the oxygen concentration of the furnace internal atmosphere. As shown in FIG. 3, the oxygen concentration of the furnace internal atmosphere was 0.015 ppm at the start of growth, and gradually increased with the lapse of time. Ten hours after the start of growth, the oxygen concentration reached 0.02 ppm. Thereafter, the oxygen concentration continuously increased, and was about 0.07 ppm after 40 hours.

Figure 4A:
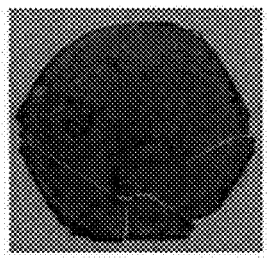
FIGS. 4A-4B are photographs of a seed substrate taken after growth of GaN crystal according to Example 1.
Figure 4B:
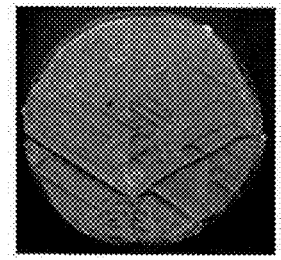

Forty hours after the start of growth of a GaN crystal, the temperature and pressure were changed to ambient temperature and normal pressure, whereby the growth of a GaN crystal was terminated. The seed substrate was removed from the furnace and washed with ethanol or the like, to thereby remove Na and Ga. FIG. 4(*a*) is a photograph of a surface of the seed substrate (GaN crystal growth side), and FIG. 4(*b*) is a fluorescent image of the surface of the seed substrate. Observation of the GaN crystal formed on the seed substrate shows that GaN was uniformly grown on the entire surface of the seed substrate. The average film thickness was found to be 0.5 mm, and no anomalous growth was observed at the periphery of the seed substrate.

Comparative Example 1

Figure 5A:
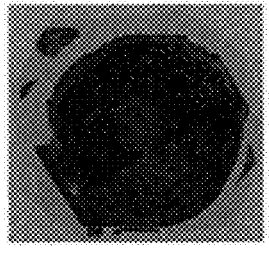
FIGS. 5A-5B are photographs of a seed substrate taken after growth of GaN crystal according to Comparative Example 1.
Figure 5B:
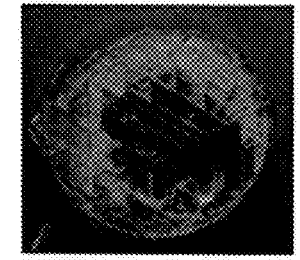

The procedure of Example 1 was repeated, except that the nitrogen atmosphere of the lower chamber was not substituted by dry air, to thereby conduct growth of a GaN crystal for 40 hours. In a manner similar to that of Example 1, the relationship between the growth time and the oxygen concentration of the furnace internal atmosphere was investigated. As shown in FIG. 3, the oxygen concentration of the furnace internal atmosphere was about 0.01 ppm, and almost constant. FIG. 5(*a*) is a photograph of a surface of the seed substrate (GaN crystal growth side), and FIG. 5(*b*) is a fluorescent image of the surface of the seed substrate. Through observation of the GaN crystal formed on the seed substrate, the average film thickness was found to be 0.5 mm. However, as shown in FIG. 5, anomalous growth was observed at the periphery of the seed substrate, such that no substantial growth of GaN was observed at the periphery of the seed substrate. When the seed substrate was observed from the backside thereof, the GaN layer of the seed substrate at the anomalous growth region was found to be melted back.

Comparative Example 2

Figure 6A:
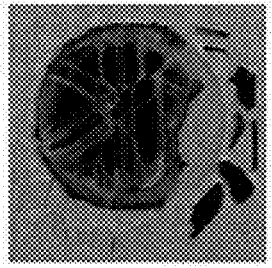
FIGS. 6A-6B are photographs of a seed substrate taken after growth of GaN crystal according to Comparative Example 2.
Figure 6B:
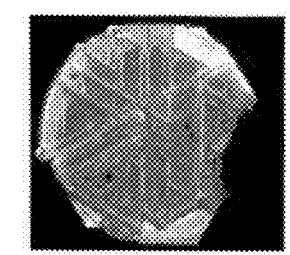

The procedure of Example 1 was repeated, except that the atmosphere gas of the lower chamber was substituted by dry air immediately after placement of a crucible in a furnace in which a seed substrate and raw materials were placed, to thereby control the oxygen concentration of the atmosphere to >0.1 ppm. In this state, growth of a GaN crystal was conducted for 64 hours. FIG. 6(*a*) is a photograph of a surface of the seed substrate (GaN crystal growth side), and FIG. 6(*b*) is a fluorescent image of the surface of the seed substrate. The obtained GaN crystal was found to have an average film thickness of 0.7 mm. However, as shown in FIG. 6, anomalous growth was observed at the periphery of the seed substrate, such that no substantial growth of GaN was observed at the periphery of the seed substrate. When the seed substrate was observed from the backside thereof, the GaN layer of the seed substrate at the anomalous growth region was found to be melted back.

Second Embodiment

1. Stack Structure of Semiconductor

Figure 7:
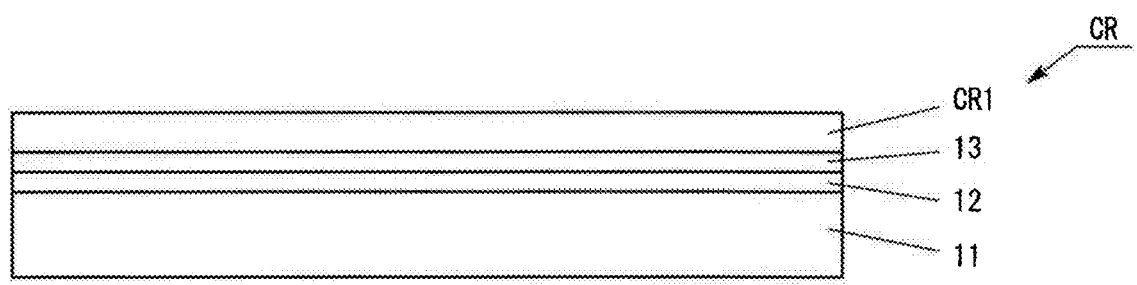
FIG. 7 is a sketch showing the stack structure of a semiconductor produced through an embodiment of the present invention.

FIG. 7 shows a stack structure CR of a semiconductor grown on a seed substrate through the flux method according to the embodiment. As shown in FIG. 7, the seed substrate serves as a template substrate and has a GaN layer 13 grown through MOCVD on a buffer layer 12 formed on the sapphire substrate 11. Through employment of the GaN layer 13 as a seed crystal, a GaN single crystal CR1 is grown through the flux method. The GaN single crystal CR1 can be isolated by removing the sapphire substrate 11 from the stack structure CR, to thereby provide a GaN substrate. On the stack structure CR or the isolated GaN substrate, a thick layer of a Group III nitride semiconductor such as GaN may be grown through hydride chemical vapor deposition, to thereby provide a thick-film substrate.

2. Semiconductor Crystal Production Apparatus

Figure 8:
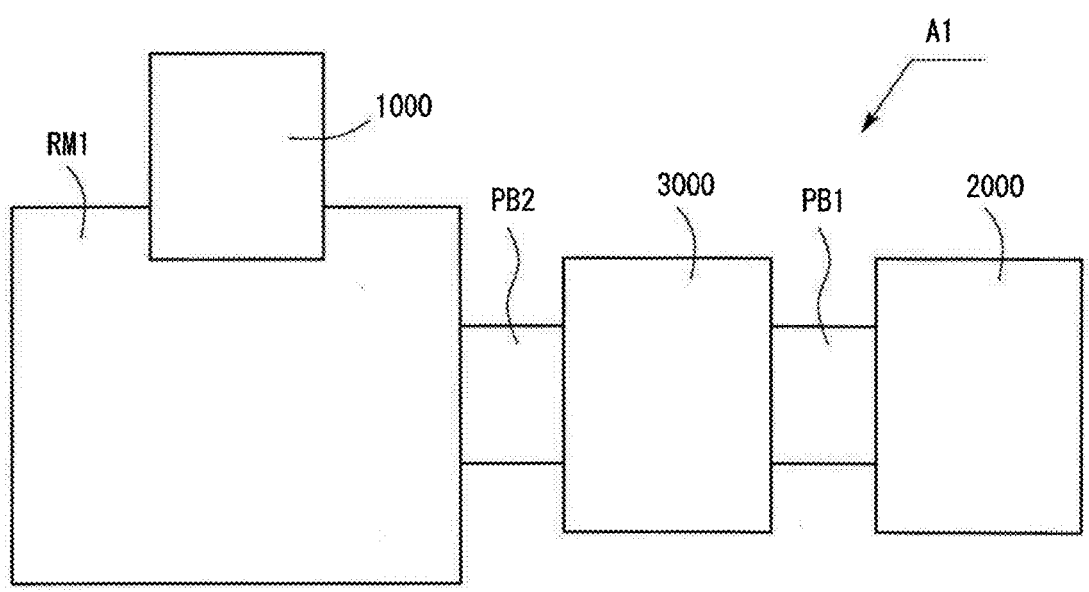
FIG. 8 is a conceptual and general representation of a production apparatus employed in a production method according an embodiment.

FIG. 8 is a conceptual and general representation of a semiconductor production apparatus according to the embodiment. As shown in FIG. 8, a production apparatus A1 has a crystal growth apparatus 1000, an Na circulation apparatus 2000, a glovebox 3000, a joint chamber RM1, and pass boxes PB1 and PB2. The crystal growth apparatus 1000, shown in FIG. 1, is employed for growth of a Group III nitride semiconductor on a seed substrate. The Na circulation apparatus 2000 regulates the purity of Na material. The glovebox 3000 is provided for conducting an operation of charging an Na material and a Ga material into the crucible. The glovebox 3000 is provided with an oxygen meter for controlling the internal oxygen concentration, and a dew point meter for controlling the internal water content. The joint chamber RM1 is provided for joining the crucible to the crystal growth apparatus 1000. The pass box PB1 is an apparatus for transferring a material, the crucible, etc. to the glovebox 3000, while the pass box PB2 is an apparatus for transferring the crucible from the glovebox 3000 to the joint chamber RM1.

3. Crystal Growth Apparatus

The crystal growth apparatus shown in FIG. 1 was employed. The configuration of the apparatus is the same as described in relation to the first embodiment, and detailed descriptions will be omitted.

4. Na Circulation Apparatus 4-1. Configuration of Na Circulation Apparatus

Figure 9:
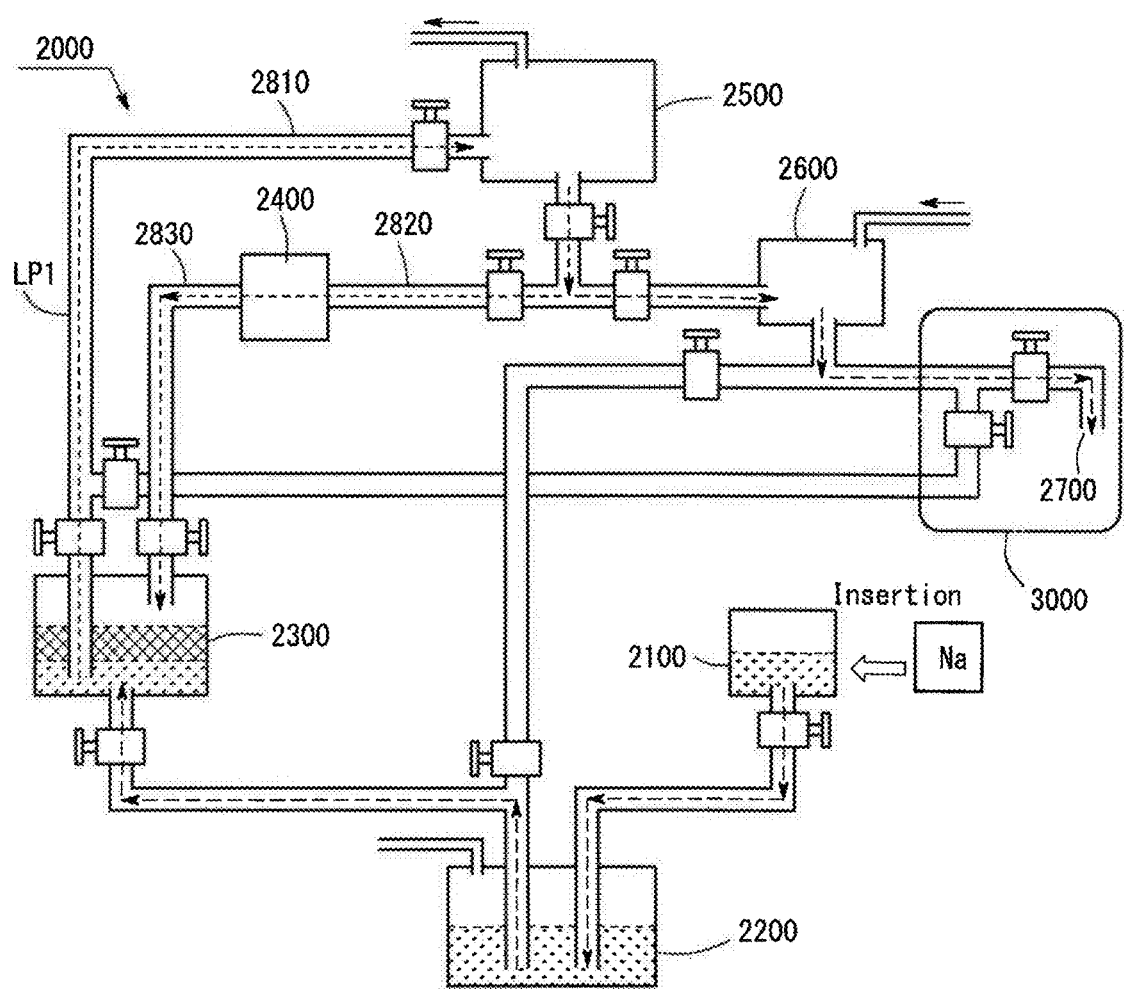
FIG. 9 is a schematic configuration of an Na circulation apparatus.

FIG. 9 is a schematic configuration of the Na circulation apparatus 2000 for employment in the semiconductor single crystal production method according the embodiment. The Na circulation apparatus 2000 circulates Na, to thereby enhance the purity of circulated Na. Since the Na circulation apparatus 2000 is connected to the glovebox 3000, the Na material which has been highly purified by means of the Na circulation apparatus 2000 can be transferred into the glovebox 3000, in which the dew point and the atmosphere are controlled. Thus, the Na material fed into the container disposed in the glovebox 3000 is prevented from reacting with oxygen and water. The Na circulation apparatus 2000 has a supply tank 2100, a dump tank 2200, a cold trap 2300, an electromagnetic pump 2400, an expansion tank 2500, a measuring tank 2600, an Na collection outlet 2700, and pipes 2810, 2820, and 2830. The Na circulation apparatus 2000 further includes other pipes, valves, and a heating apparatus for heating a relevant member. The heating apparatus can maintain a temperature predetermined for the target member.

The Na circulation apparatus 2000 has a circulation path LP1 through which the Na material in liquid form is passed. The circulation path LP1 includes the cold trap 2300, the expansion tank 2500, the electromagnetic pump 2400, and the pipes 2810, 2820, and 2830. The supply tank 2100 is a tank for feeding initial Na material to the Na circulation apparatus 2000. Although the initial Na material has considerably high purity, it contains a small amount of impurities. The initial Na material is solid. Since the supply tank 2100 is heated, the Na material becomes liquid. The liquid-form Na material is transferred to the dump tank 2200. The dump tank 2200 can absorb reflected shock wave.

The cold trap 2300 removes impurities contained in the Na material and also functions as an Na purity controlling section for removing oxygen from or adding oxygen to Na. The cold trap 2300 will be further described later. The electromagnetic pump 2400 returns the Na material from the expansion tank 2500 to the cold trap 2300. The Na circulation apparatus 2000 causes the Na material to be circulated between the cold trap 2300 and the expansion tank 2500, to thereby purify the Na material. The expansion tank 2500 is a tank for temporarily storing therein the Na material from which impurities have been removed by means of the cold trap 2300 (i.e., Na material storing section). The measuring tank 2600 measures the amount of Na material collected through the Na collection outlet 2700. The Na material maintained in the measuring tank 2600 has satisfactorily high purity. The Na collection outlet 2700 serves as an outlet for feeding the purified Na material to the glovebox 3000.

4-2. Operation Mechanism of Na Circulation Apparatus

As described above, the solid-form Na material is fed to the supply tank 2100 of the Na circulation apparatus 2000. The Na material is heated by means of the supply tank 2100, to thereby form the corresponding liquid-form Na material. The liquid-form Na material is little by little transferred to the dump tank 2200. Then, the liquid-form Na material in the dump tank 2200 is transferred to the circulation path LP1. As a result, the liquid-form Na material is circulated in the circulation path LP1. The higher the temperature of the Na material, the higher the solubility of oxygen in Na. The temperature of the cold trap 2300 is the lowest in the circulation path LP1. Thus, an impurity such as $Na_2O$ is deposited in the cold trap 2300. $Na_2O$ is removed through a filter or the like. During circulation in the circulation path LP1, the liquid-form Na material passes alternately and repeatedly through two different phases; i.e., a high temperature phase and a low temperature phase. Thus, oxygen is repeatedly removed from the liquid-form Na material, and a high-purity Na material can be recovered. The Na material fed through the Na collection outlet 2700 is a liquid. The liquid-form Na material is poured into a container in the glovebox 3000 and cooled in the container, to thereby form the corresponding solid.

4-3. Temperature of Cold Trap

The temperature (i.e., second temperature) of the cold trap 2300 is adjusted to 120° C. to 300° C. The temperatures (i.e., first temperatures) of the expansion tank 2500 and the pipes 2810, 2820, and 2830 therearound are adjusted to >300° C. to 500° C., which is higher than the temperature of the cold trap 2300. Since the temperature of the cold trap 2300 is lower than that of another section, impurities in the Na material can be removed by means of the cold trap 2300. There is a correlation between the temperature set for the cold trap 2300 and the oxygen concentration of the Na material. Therefore, through selecting the temperature (i.e., second temperature) of the cold trap 2300 to fall within a range of 120° C. to 300° C., the oxygen concentration or the like of the Na material can be regulated.

5. Glovebox

Figure 10:
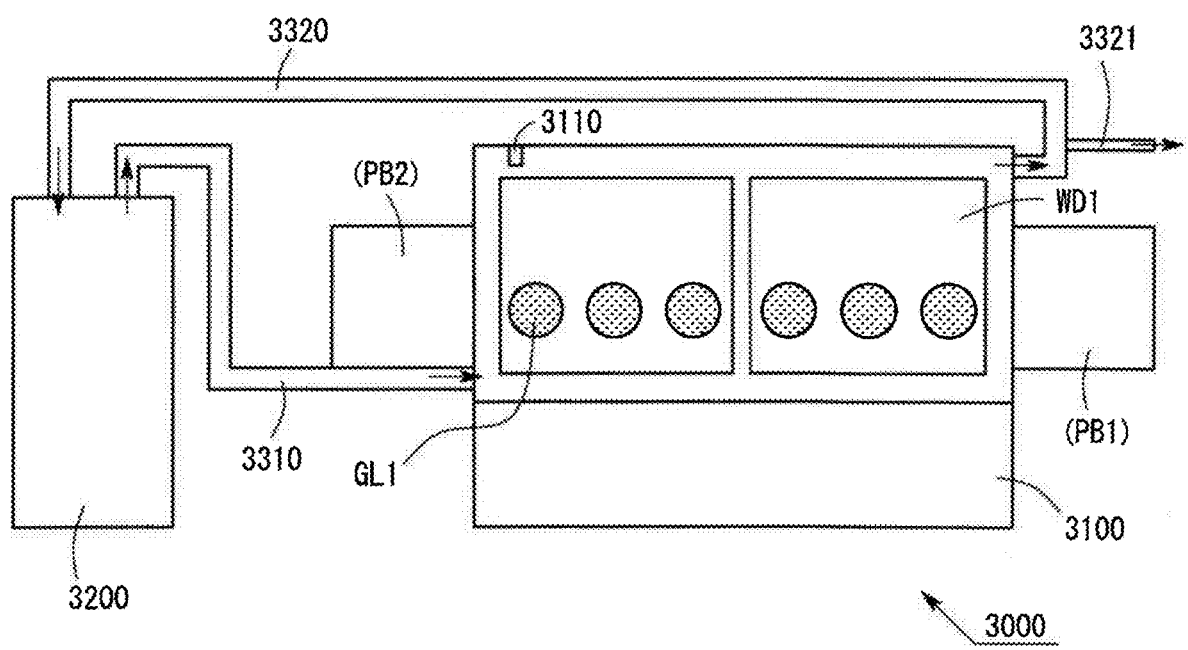
FIG. 10 is a schematic configuration of a glovebox for producing a semiconductor single crystal.

FIG. 10 is a sketch of the glovebox 3000 employed in the production method according to the embodiment. The glovebox 3000 is a chamber in which the Na material and other materials are treated. In order to prevent intrusion of air around the glovebox 3000 into the inside of the glovebox 3000, the internal pressure of the glovebox 3000 is set to a pressure slightly higher than 1 atm. The glovebox 3000 has a housing 3100, gloves GL1, windows WD1, a dew point meter 3110, an Ar circulation apparatus 3200, an Ar feed pipe 3310, an Ar exhaust pipe 3320, an Ar ventilation hole 3321, and an $O_2$ sensor (not illustrated). The housing 3100 can maintain the internal atmosphere under predetermined conditions. An operator conducts operations (e.g., treatment of Na material) in the glovebox 3000 by use of gloves GL1. The operator visually confirms the state inside the glovebox 3000 through the windows WD1. The dew point of the glovebox 3000 is measured by means of the dew point meter 3110.

The Ar circulation apparatus 3200 is an apparatus for feeding and collecting Ar gas. The Ar feed pipe 3310 is disposed for feeding Ar gas from the Ar circulation apparatus 3200 into the glovebox 3000. The Ar exhaust pipe 3320 is disposed for collecting Ar gas into the Ar circulation apparatus 3200. The Ar exhaust pipe 3320 is branched to the Ar ventilation hole 3321 in the pipe line thereof. On the downstream side of the Ar ventilation hole 3321, the $O_2$ sensor is disposed. By virtue of the presence of the Ar circulation apparatus 3200, the internal atmosphere of the glovebox 3000 is Ar. The internal oxygen concentration of the glovebox 3000 is 0.05 ppm or less, which is determined by means of the $O_2$ sensor in the Ar ventilation hole 3321. An example of the $O_2$ sensor is DF-150E (product of Servomex). The internal water content of the glovebox 3000 is 0.05 ppm or less. A value of 0.05 ppm corresponds to a dew point of −94° C. The water content is measured by means of the dew point meter 3110. An example thereof is an electrostatic capacitance-based dew point meter MMS35 (product of GE Sensing & Inspection Technologies).

6. Impurity Concentration (Oxygen Intake Amount)

In this embodiment, a semiconductor single crystal is grown by the production apparatus A1, while the amount of impurities possibly migrating into the crucible CB1 is controlled. The impurities mainly include oxygen and water. In the crystal growth apparatus 1000, the oxygen concentration and the hydrogen concentration are controlled to a high degree.

7. Grains 7-1. Relationship Between Oxygen Intake Amount and Grains

Figure 11:
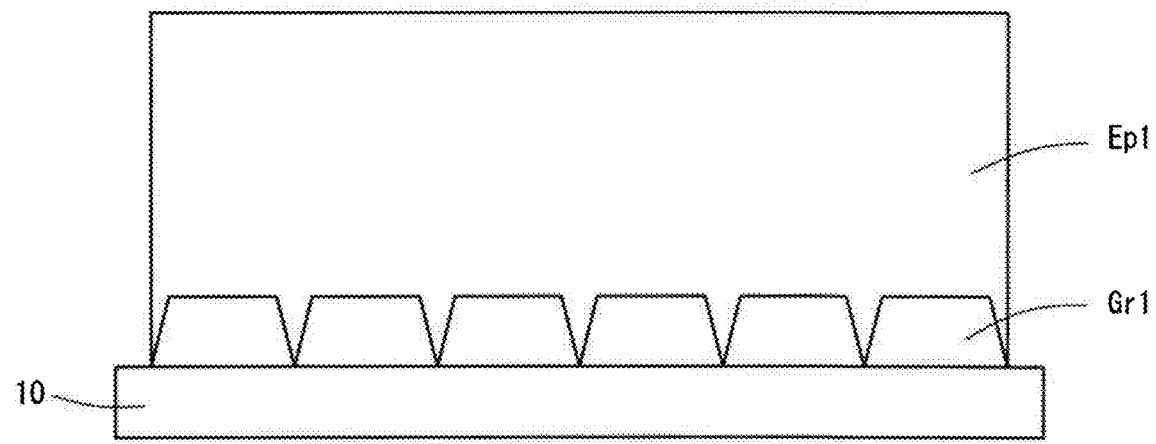
FIG. 11 is a sketch of large grains grown on a seed substrate at an initial stage of semiconductor growth.
Figure 12:
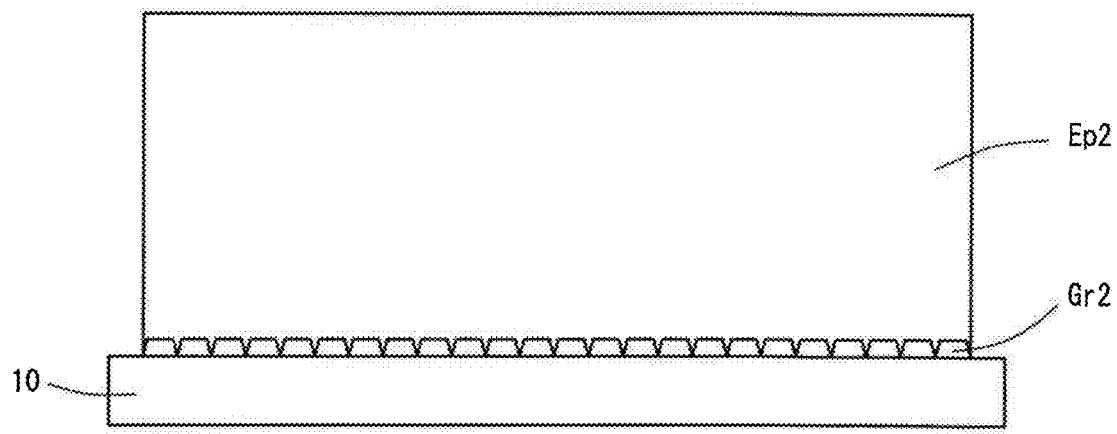
FIG. 12 is a sketch of small grains grown on a seed substrate at an initial stage of semiconductor growth.

There will next be described the amount of oxygen incorporated into the molten liquid and the grains formed on the seed substrate. FIGS. 11 and 12 are sketches for describing the seed substrate and the grains grown thereon. As shown in the figures, grains Gr1 are grown on a seed substrate 10, and then a semiconductor layer Ep1 is grown. Each grain Gr1 assumes just or nearly a shape of truncated hexagonal pyramid. The grains Gr1 of FIG. 11 are greater in size than grains Gr2 of FIG. 12. As shown in FIG. 11, when the amount of oxygen incorporated into the molten liquid is small, the grain size is larger. In contrast, as shown in FIG. 12, when the amount of oxygen incorporated into the molten liquid is large, the grain size is smaller. In addition, the larger the gain size, the smaller the stress of the semiconductor crystal grown in the seed substrate. The possible reason for this is that the areas of the joined surface at which semiconductor crystals grown from unit grains intermingle with one another decrease. The greater the grain size, the smaller the warpage of the grown semiconductor single crystal.

7-2. Grain Size

Figure 13:
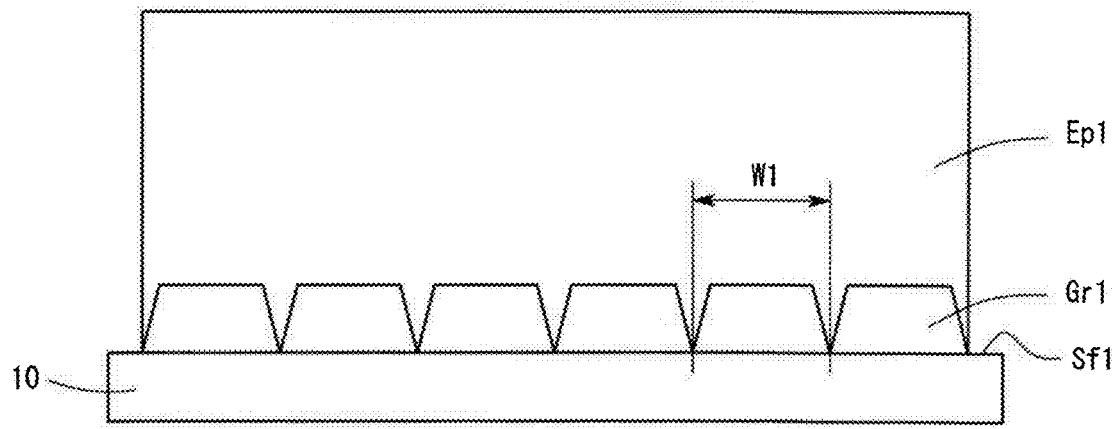
FIG. 13 is a sketch showing the definition of the size of a grain grown on a seed substrate at an initial stage of semiconductor growth.

As shown in FIG. 13, the mean width W1 between the grains Gr1 at the interface Sf1 between the seed substrate 10 and the grown semiconductor layer Ep1 is preferably 10 μm to 100 μm. In order to more suitably observe the features, the observation cross-section is created by removing the surface of the as-formed surface in a certain amount (some micrometers to some ten micrometers) through polishing or a similar technique, to thereby attain a flat surface. Then, the cross-section is observed under a fluorescent microscope or a cathode luminescent device. As described hereinafter, through removal of oxygen atoms from the Na material, the grain size can increase, to thereby grow a semiconductor crystal having small internal stress. Needless to say, this is essential for preventing contamination with oxygen in a semiconductor production device and during the course of the production process.

8. Semiconductor Single Crystal Production Method

A first production method includes a maintenance step of maintaining the Na material in a storage chamber, and a semiconductor growth step of adding an Na material, a Ga material, and a seed substrate into a crucible, to thereby realize the growth of a Group III nitride semiconductor on the seed substrate. A second production method includes an Na purity controlling step of controlling the Na purity of the Na material by means of the Na circulation apparatus, and a semiconductor growth step of adding an Na material, a Ga material, and a seed substrate into a crucible, to thereby realize the growth of a Group III nitride semiconductor on the seed substrate.

8-1. Seed Substrate Preparation Step

Figure 14:
FIG. 14 is a sketch of a seed substrate.

First, a seed substrate is provided. FIG. 14 is a schematic view of the seed substrate 10. As shown in FIG. 14, the seed substrate 10 has the sapphire substrate 11, the buffer layer 12, and the GaN layer 13. The buffer layer 12 is formed on the c-plane of the sapphire substrate 11 through MOCVD. The buffer layer 12 is formed of, for example, GaN, but may be formed of TiN or AlN. Subsequently, the GaN layer 13 is formed on the buffer layer 12, to thereby yield the seed substrate 10. The buffer layer 12 and the GaN layer 13 serve as seed layers. Notably, in place of GaN, the semiconductor formed on the sapphire substrate 11 through vapor phase growth may also be AlGaN, InGaN, or AlInGaN. The GaN layer 13 undergoes melting back in the flux under certain conditions. In such a case, a part of the GaN layer 13 is dissolved in the flux. The seed substrate 10 may be commercially available. Alternatively, examples of the seed substrate 10 which may be used in the invention include a mask-formed GaN substrate, a GaN substrate obtained by processing GaN, and a patterned GaN substrate obtained by selectively removing GaN.

8-2. Na Purity Control Step

First, the Na material is purified by means of the Na circulation apparatus 2000. Through heating a solid Na material, a corresponding liquid-form Na material is formed. In the liquid Na material, oxygen is dissolved in a larger amount as the temperature of the Na material increases. The temperature of the cold trap 2300 is 120° C. to 300° C. Since the temperature of the expansion tank 2500 is higher than that of the cold trap 2300, $Na_2O$ or the like is deposited in the cold trap 2300. The thus-deposited impurities such as Na$_2$O are removed through a filter or the like. During passage of the molten Na material a plurality of times through the cold trap 2300 and the expansion tank 2500, impurities such as Na$_2$O are gradually removed.

Thereafter, while the liquid Na material is weighed, the material is poured from the Na circulation apparatus 2000 to the container placed in the glovebox 3000. The molten Na material placed in the container in the glovebox 3000 is cooled in the glovebox 3000, to thereby form a solid thereof. The glovebox 3000 also serves as a maintenance chamber in which the dew point and oxygen concentration are regulated. The internal atmosphere of the glovebox 3000 contains ≤0.05 ppm oxygen and ≤0.05 ppm water.

Then, in the glovebox 3000 the solid Na material is cut to pieces having specific dimensions. For example, a piece of a rectangular parallel-pipe form is cut from the Na material. The solid Na material obtained by cooling the liquid Na material from the Na circulation apparatus 2000 may be used without cutting. Alternatively, a commercial Na material as is may be used without employing the Na circulation apparatus 2000. In the case where the surface of the Na material has been oxidized or attached with an oil for safely storing Na, the surface oxide layer or oil attached surface is removed by cutting.

8-3. Maintenance Step

Figure 15:
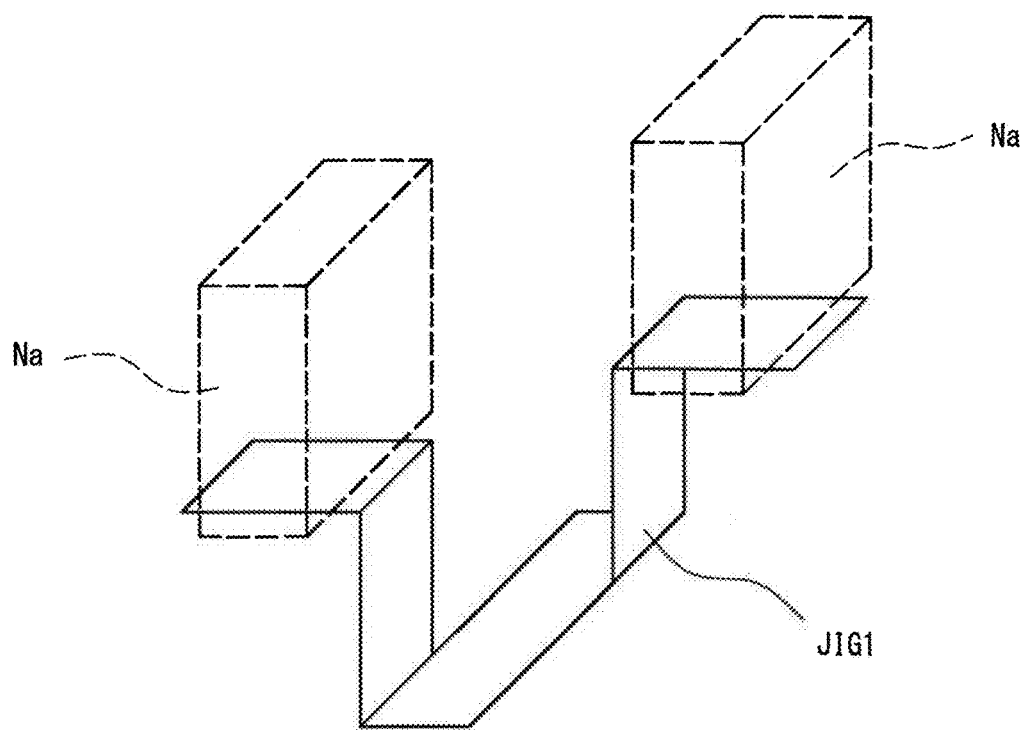
FIG. 15 a sketch of a jig employed in a semiconductor single crystal production method of an embodiment.

The pieces of Na material are maintained in the glovebox 3000 for a specific period of time. Specifically, as shown in FIG. 15, pieces of the Na material are placed on a jig JIG1 disposed in the glovebox 3000. Through employment of the jig JIG1, the surface of the Na material can serve as a uniform reaction surface. When the jig JIG1 is provided with electrical conductivity, electrostatic charging of Na can be prevented. In contrast, Ga is not necessarily maintained in the glovebox 3000, and may be provided immediately before entrance to the crucible CB1. Thus, reaction of Ga with oxygen or water can be suppressed.

Figure 16:
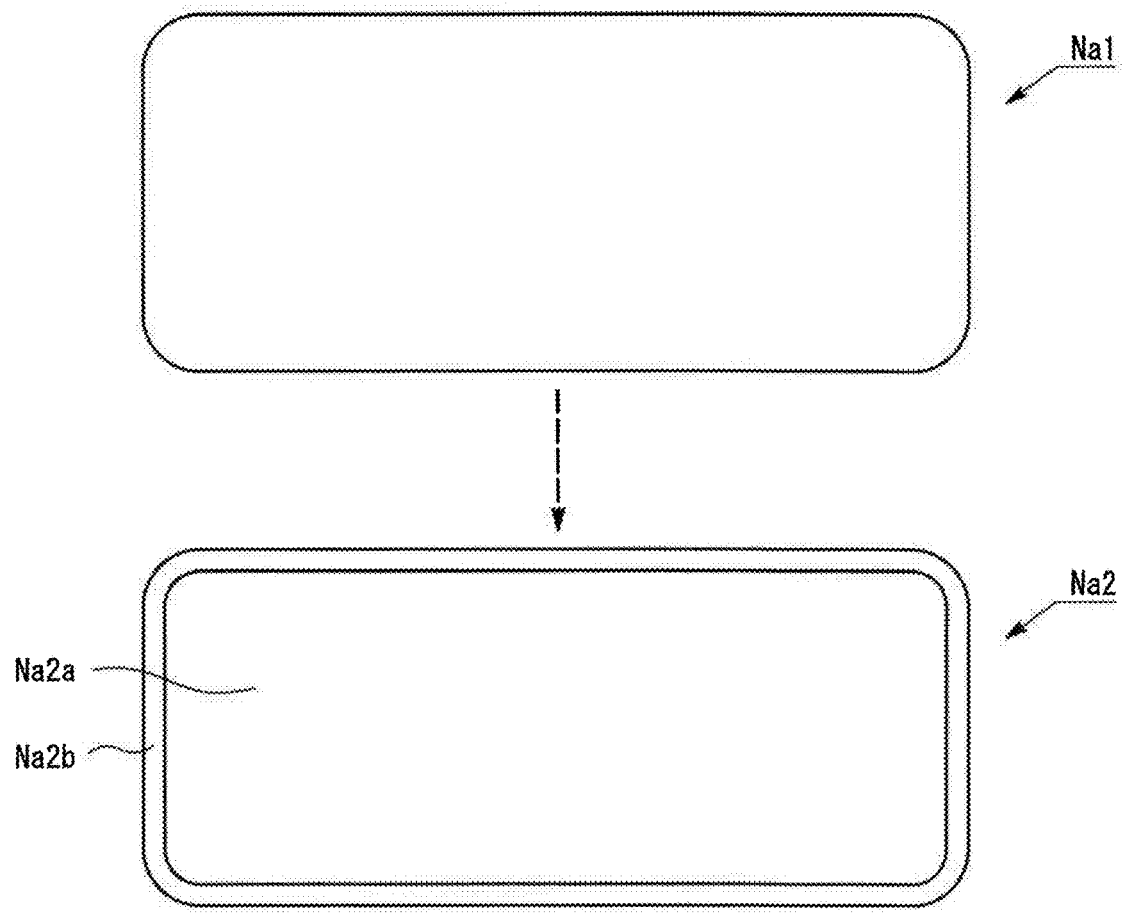
FIG. 16 is a sketch showing modification of the surface of a semiconductor according to a production method of an embodiment.

As shown in FIG. 16, when an Na material Na1 is allowed to stand in the glovebox 3000, an Na material Na2 having a surface modified via oxidation or hydroxidation is formed. The Na material Na2 consists of a core portion Na2$a$ and a surface portion Na2$b$. The surface portion Na2$b$ is a surface modification layer which has been formed through reaction of Na with oxygen or water present in the glovebox 3000. The core portion Na2$a$ is resistant to oxidation and other effects and maintains the same composition as that of the high-purity Na material Na1. A purity of the high-purity Na material Na1 may be higher than 8 nines (99.999999% 8 N). TABLE 1 shows conditions in the glovebox 3000, including oxygen concentration and water content. The internal atmosphere of the glovebox 3000 has an oxygen concentration of 0.05 ppm or less and greater than 0 ppm and may have an oxygen concentration of 0.01 ppm or less and greater than 0 ppm. The internal atmosphere of the glovebox 3000 has a water content of 0.05 ppm or less and may have a water content of 0.01 ppm or less.

In the glovebox 3000, the Na material reacts mainly with oxygen or water, to thereby form Na oxide or Na hydroxide on the surface thereof. In other words, the Na surface is modified, to thereby form a modification layer. The weight of the Na material increases by the modification reaction. Here, the Na surface modification weight ratio is defined as follows. The weight of Na when the surface thereof has no surface-modified portion is defined as a reference weight. Generally, the reference weight of Na refers to the weight of an Na piece which is obtained by cutting a highly purified Na material and weighing the piece immediately after cutting. The ratio of the weight of surface-modified Na to the weight of the reference weight is defined as a surface modification weight ratio. Thus, surface modification weight ratio is represented by (reference weight+weight increase by surface modification)/reference weight). Until the surface modification weight ratio reaches a specific value falling within the range of 1.000002 to 1.001, the Na material is maintained in the aforementioned atmosphere. The weight of the Na material is measured in the glovebox 3000 by means of an electronic balance or a similar device. The Na material is placed on the electronic balance or the like. When the weight becomes a specific constant value, the maintenance is stopped. An example of the electronic balance is CPA225D (product of Sartorius). When the increase in weight of the Na material is regulated in, for example, the glovebox 3000 in which oxygen concentration and water content are accurately controlled, the surface modification weight ratio of Na can be controlled with high reproducibility. Meanwhile, as the period of time for allowing the Na material to stand in the glovebox 3000 becomes longer, the weight of the Na material increases further. That is, the surface modification weight ratio increases. The maintenance time (retention time) is, for example, 1 hour to 72 hours. Needless to say, the maintenance time may be set to another value. However, when oxygen and water contained in the glovebox 3000 are completely consumed, oxidation reaction is terminated. Thus, the maximum weight increase of the Na material and the maximum value of the surface modification weight ratio are determined from the volume of the glovebox 3000 and the amounts of oxygen and water. Other than the cases of the maximum values, if the oxygen concentration and water content in the glovebox 3000 are accurately regulated, the surface modification weight ratio of Na can be controlled by the maintenance time.

TABLE 1

| | |
|---|---|
| Oxygen concentration | ≤0.05 ppm |
| Water content | ≤0.05 ppm |
| Surface modification weight ratio of Na material | 1.000002 to 1.001 |

8-4. Semiconductor Growth Step

A semiconductor single crystal layer is grown on the seed substrate 10 through a flux method. TABLE 2 shows the exemplary raw materials used in the growth. The carbon ratio may be modified to fall within the range of 0.1 mol % to 2.0 mol %. Notably, the values given in TABLE 2 are merely examples, and other values may be acceptable. Also, a doping element may be further added. The semiconductor single crystal to be grown is a single crystal of a Group III nitride semiconductor such as GaN. In order to reduce the oxygen concentration and water content to as low a level as possible, the inside of the crystal growth apparatus 1000 is baked prior to the growth. Through the preliminary baking, variation in oxygen concentration and water content in the furnace among growth batches can be minimized.

Ga and Na are placed in the crucible CB1, and the seed substrate 10 is placed on Na and Ga, while the crystal growth plane of the substrate is oriented upward. During transfer of the crucible CB1 from the glovebox 3000 to the reaction chamber 1300, the crucible CB1 is placed in a triple-wall growth vessel, for the purpose of preventing reaction of the Na material with oxygen or water. In order to more effectively suppress the reaction of the Na material, the path of the transfer is preferably provided in a nitrogen atmosphere. Subsequently, the crucible CB1 is placed on the turn table 1330 in the reaction chamber 1300, and the pressure vessel 1100 is evacuated. The vessel is heated and pressurized, and the crucible CB1 is rotated, whereby a semiconductor single crystal is grown. In the semiconductor growth step, the seed substrate 10 falls in a molten liquid of Na and Ga, and the semiconductor single crystal is grown from the crystal growth plane of the seed substrate 10. The method and timing of stirring may be arbitrarily chosen, and the growth may be performed under no stirring. Also, the speed, rotational direction, and timing of start/stop may be freely modified in the course of growth.

TABLE 2

| Raw material | Amount |
|---|---|
| Ga/Na ratio | 10 to 40 mol % |
| C | 0.1 mol % to 2.0 mol % (to Na) |

TABLE 3 shows conditions of the crucible used in the semiconductor single crystal formation step. The temperature and pressure of the semiconductor single crystal growth are, for example, 870° C. and 3 MPa. The growth time is about 20 hours to 200 hours. Notably, the oxygen concentration and water content of the internal atmosphere of the crystal growth apparatus 1000 are determined by means of Qmass.

TABLE 3

| Temperature | about 700° C. to about 900° C. |
|---|---|
| Pressure | 2 MPa to 10 MPa |
| Stirring speed | 0 rpm to 100 rpm |
| Growth time | 20 to 200 hours |

9. Variations
9-1. Maintenance Step

In the maintenance step of a variation, the Na surface modification weight ratio is regulated by feeding a gas mixture containing oxygen and water into the glovebox 3000. Through this technique, the Na material can be reacted with oxygen or water within a short period of time. In one specific procedure, the glovebox 3000 is evacuated, and then the Na material is placed in the glovebox 3000. A gas containing oxygen and water is fed into the glovebox 3000. After oxygen and water contained in the internal atmosphere of the glovebox 3000 have been completely consumed, reaction of the Na material with oxygen and water is terminated. Through the above procedure, the maximum weight increase of the Na material; i.e., the surface modification weight ratio, may be controlled.

9-2. Controlling of Na Surface Modification Weight Ratio by Maintenance Chamber

The Na surface modification weight ratio may also be controlled by a maintenance chamber other than the glovebox 3000. The maintenance chamber allows control of the dew point and oxygen concentration. The maintenance chamber may be evacuated, or various gases may be introduced thereinto. In one procedure, the Na material is placed in the maintenance chamber, and the chamber is evacuated. Then, a gas containing oxygen and water is fed into the maintenance chamber, and the chamber is tightly closed. After oxygen and water contained in the internal atmosphere of the maintenance chamber have been completely consumed, reaction of the Na material with oxygen and water is terminated. Through the above procedure, the maximum weight increase of the Na material; i.e., the maximum value of the surface modification weight ratio, may be controlled.

9-3. Modification of Na in Semiconductor Growth Step

In the semiconductor growth step, a gas mixture containing oxygen and water may be fed into the crystal growth apparatus 1000 accommodating the crucible CB1. Through this technique, the Na material can be reacted with oxygen or water also in the semiconductor growth step. In one specific procedure, a gas mixture containing oxygen and water may be fed through the gas intake inlet 1510.

9-4. Na Material Cutting Step and Semiconductor Growth Step

Figure 17:
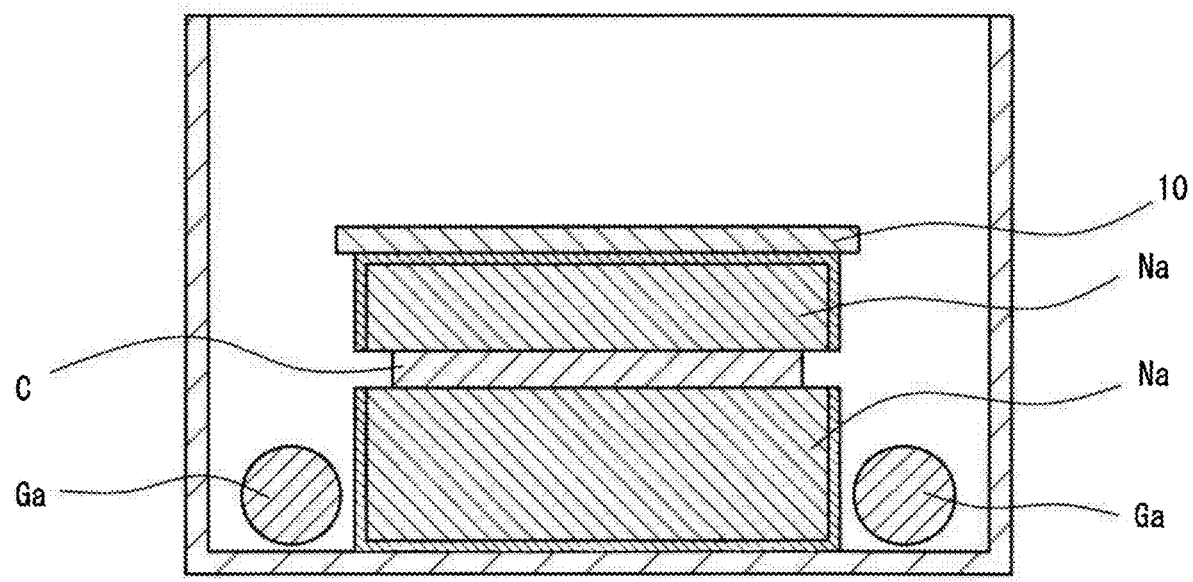
FIG. 17 is a sketch showing the contact between carbon and a non-oxidized surface of Na in a crucible according to a production method of an embodiment.
Figure 18:
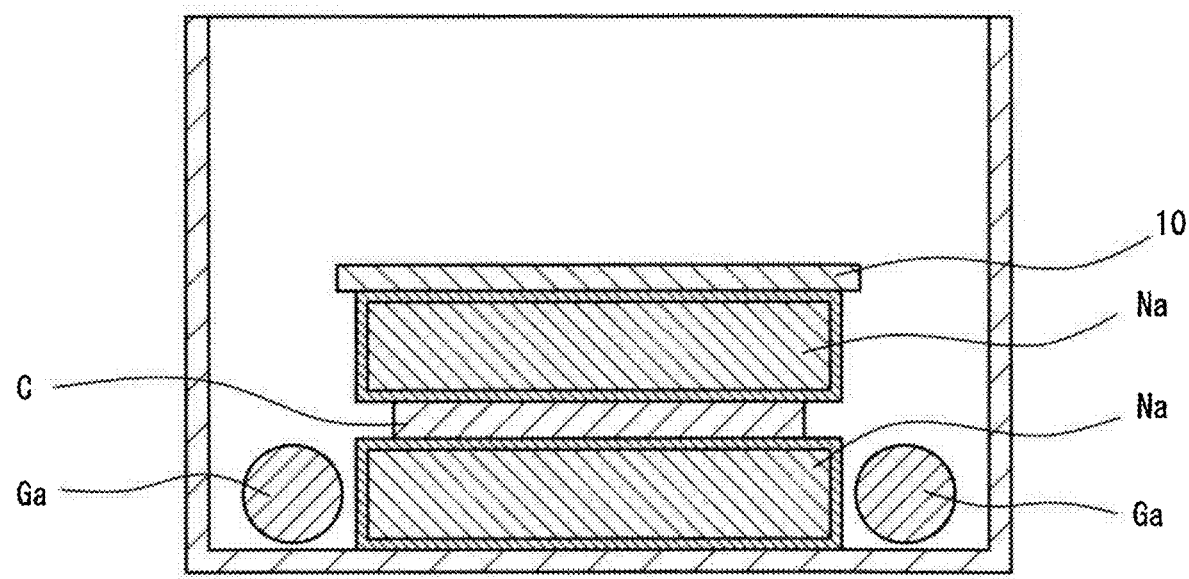
FIG. 18 is a sketch showing the contact between carbon and an oxidized surface of Na in a crucible according to a production method of an embodiment.

Preferably, after completion of the maintenance step; that is, after completion of appropriate surface modification of Na, an Na material cutting step is carried out. When the Na material is thicknesswise divided into two almost equal portions, each cut surface has no surface modification layer (e.g., oxide film). As shown in FIG. 17, a carbon material is placed such that it is sandwiched by Na cut surfaces of the high-purity Na material. In other words, the carbon material is not in contact with an oxide or hydroxide plane of the Na material. In the semiconductor growth step, when the Na material is melted, the carbon material is dispersed with the Na material. Since the melting points of sodium oxide and sodium hydroxide are higher than the melting point of sodium, when the Na material has a sodium oxide plane or a sodium hydroxide plane, dispersion of the carbon material is impeded. For example, as shown in FIG. 18, when the oxide plane or hydroxide plane of the Na material is in contact with the carbon material, difficulty is encountered in dispersing the carbon material in Na. As shown in FIG. 17, when the carbon material is not in contact with the oxide or hydroxide plane of the Na material, the carbon material can be suitably dispersed. Also, variation in dispersion state of carbon can be minimized among growth batches.

Example 2

1. Method of Experiment

A GaN single crystal semiconductor was produced by means of the production apparatus A1. The seed substrate was produced by forming a GaN layer on a sapphire substrate. In Example 2, the period of time for allowing the Na material to stand (i.e., surface modification time) was varied, whereby the surface modification weight ratio of the Na material was tuned.

2. Results of Experiment

Figure 19:
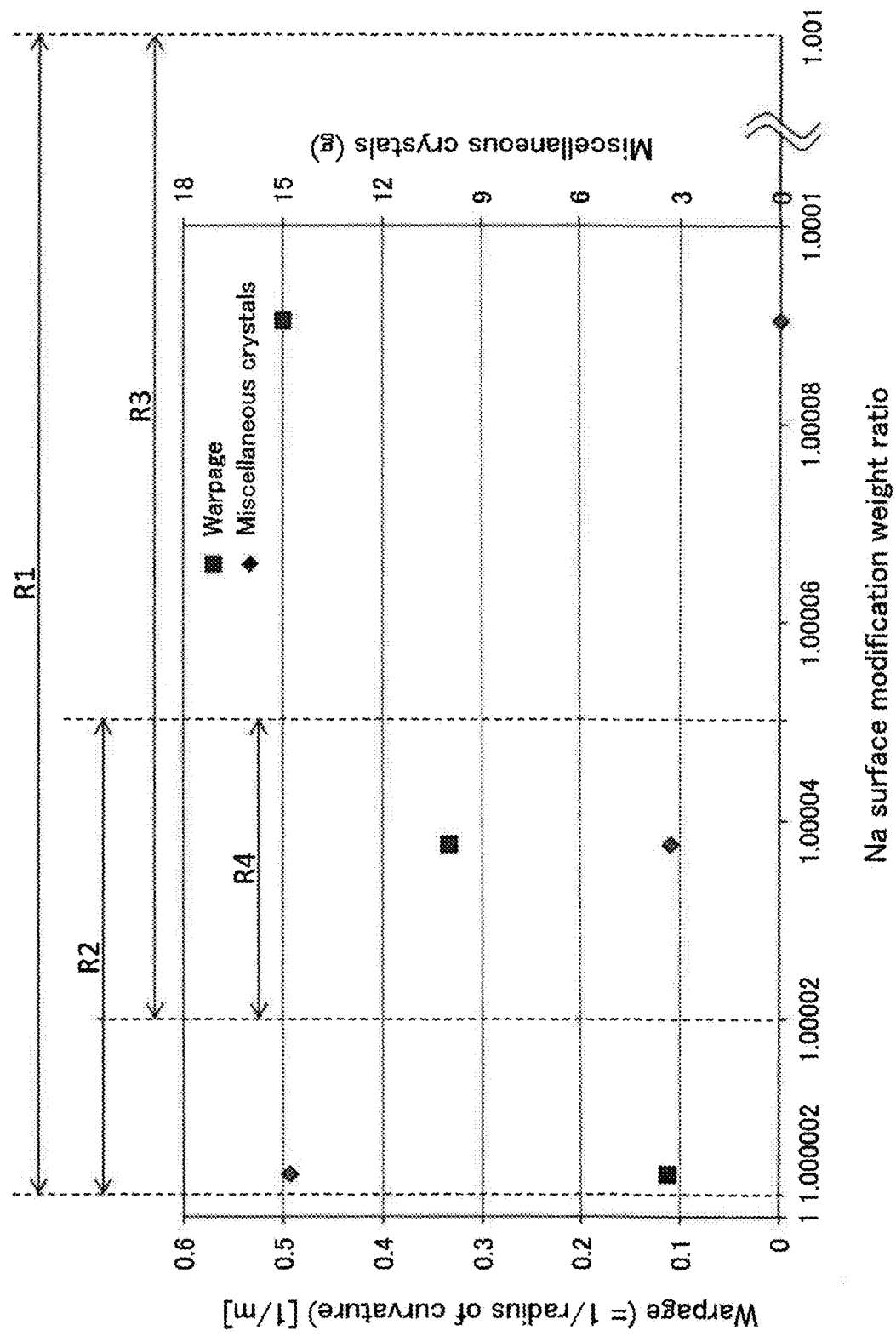
FIG. 19 is a graph showing the relationship between Na surface modification weight ratio and warpage (curvature) or amount of miscellaneous crystals in a production method according to a second embodiment.

FIG. 19 is a graph showing the relationship between Na surface modification weight ratio and warpage or amount of miscellaneous crystals. In FIG. 19, the horizontal axis represents the Na surface modification weight ratio, and the vertical axis represents the extent of warpage (reciprocal radius of curvature (1/m)) and the weight of generated miscellaneous crystals (g).

As shown in FIG. 19, the greater the Na surface modification weight ratio, the greater the curvature of the substrate. Also, the greater the Na surface modification weight ratio, the smaller the weight of generated miscellaneous crystals. That is, from the viewpoint of preventing warpage, the surface modification weight ratio of the Na material is preferably small. From the viewpoint of suppressing the amount of generated miscellaneous crystals, the surface modification weight ratio of the Na material is preferably large. The extent of warpage and the amount of generated miscellaneous crystals are in a trade-off relation.

As shown in FIG. 19, when the surface modification weight ratio of the Na material is 1.000002 to 1.001 (range R1 in FIG. 19), the warpage of the grown semiconductor is about 0.5/m or less, and the amount of generated miscellaneous crystals is about 15 g or smaller. Thus, at least one of the warpage of the semiconductor and the amount of generated miscellaneous crystals is suppressed. Also, the surface modification weight ratio of the Na material may be 1.000002 to 1.0001. When the surface modification weight ratio of the Na material is 1.000002 to 1.00005 (range R2 in FIG. 19), the warpage of the grown semiconductor is about 0.4/m or less. Thus, the warpage of the semiconductor is suppressed. When the surface modification weight ratio of the Na material is 1.00002 to 1.001 (range R3 in FIG. 19), the amount of generated miscellaneous crystals is about 5 g or smaller. Thus, the amount of generated miscellaneous crystals is suppressed. A range of the surface modification weight ratio of the Na material from 1.00002 to 1.0001 is preferred for reducing the amount of generated miscellaneous crystals. When the surface modification weight ratio of the Na material is 1.00002 to 1.00005 (range R4 in FIG. 19), the warpage of the grown semiconductor is about 0.4/m or less, and the amount of generated miscellaneous crystals is about 5 g or smaller. Thus, the warpage of the semiconductor layer and the amount of generated miscellaneous crystals are suppressed.

TABLE 4 shows the results of FIG. 19.

TABLE 4

| Na surface modification weight ratio | Warpage (1/m) | Miscellaneous crystals (g) |
| --- | --- | --- |
| 1.000004 | 0.112 | 14.795 |
| 1.000038 | 0.333 | 3.284 |
| 1.000090 | 0.500 | 0 |

As the warpage of a semiconductor decreases, the dislocation density of the semiconductor tends to decrease, and the crystallinity thereof tends to increase. In addition, as the warpage decreases, the semiconductor structure can be easily flattened by processing, to thereby narrow the off angle distribution. However, when the resultant semiconductor has considerable warpage, the thus-grown semiconductor single crystal is easily separated from the seed substrate. When the amount of generated miscellaneous crystals is large, the crystallinity of the Group III nitride semiconductor is impaired, to thereby reduce the production yield. Therefore, generally, a smaller amount of generated miscellaneous crystals is preferred. However, in order to ensure the quality of the target semiconductor products, in some cases, those skilled in the art may intentionally select the conditions where miscellaneous crystals may generate.

Third Embodiment

Virtually the same production apparatus as employed in the second embodiment is used, and only the features different from those of the second embodiment will be described. In the third embodiment, the maintenance step in the glovebox is not carried out in the Na purity control step of the second embodiment. The third embodiment is characterized by enhancing the purity of Na by means of the Na circulation apparatus described in relation to the second embodiment. The thus-purity-controlled molten Na is directly fed to the crucible. The purity of Na is controlled by means of the temperature of the cold trap 2300 (i.e., second temperature). As the temperature of the cold trap 2300 is lower, the purity of Na increases, and the oxygen content decreases.

As shown in FIG. 10, a material such as Ga is placed in the crucible CB1 disposed in the glovebox 3000. Then, the high-purity molten Na whose purity has been highly enhanced by means of the Na circulation apparatus 2000 is poured into the crucible CB1, with the feed amount being monitored. As a result, Ga is immersed in the molten Na. Subsequently, the seed substrate 10 is placed on the molten Na, while the crystal growth plane of the substrate is oriented upward. In this case, the molten Na is in contact with the bottom and wall of the crucible CB1, and the crucible is closed with the seed substrate 10. As a result, the area of the molten Na which is in contact with the environmental atmosphere is minimized, whereby oxidation of the molten Na in the crucible is prevented.

Example 3

1. Method of Experiment

The same seed substrate as employed in Example 2 was used. That is, the substrate was a template substrate formed of a sapphire substrate on which a GaN layer had been formed. The relationship between the temperature of the cold trap 2300, and the extent of warpage of the substrate after growth of GaN through the flux method or the amount of generated miscellaneous crystals was determined. The temperature of the cold trap 2300 was varied from 100° C. to 300° C. The temperature of the expansion tank 2500 was fixed at 400° C.

2. Results of Experiment

Figure 20:
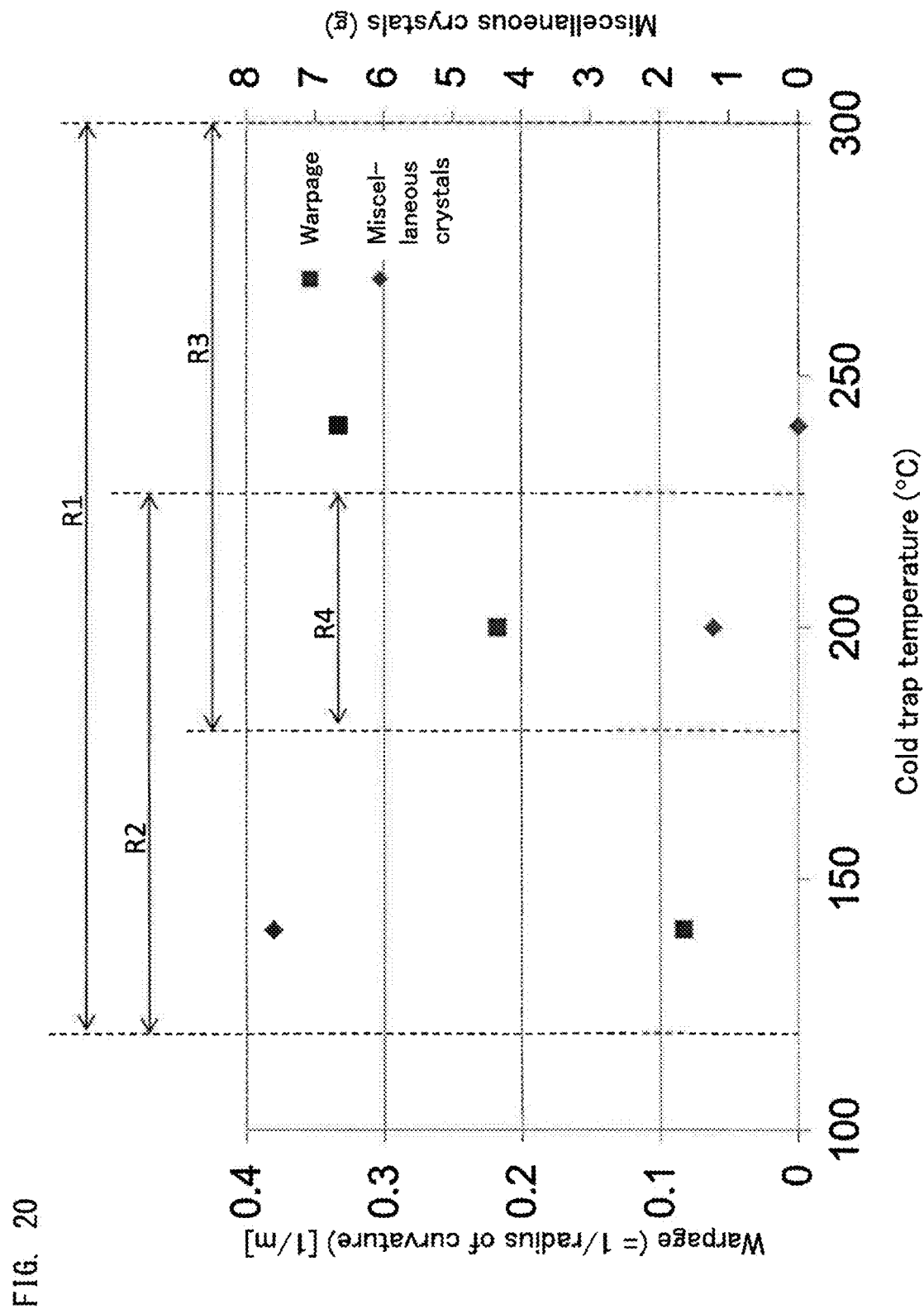
FIG. 20 is a graph showing the relationship between cold trap temperature and warpage (curvature) or amount of miscellaneous crystals in a production method according to a third embodiment.

FIG. 20 is a graph showing the relationship between the temperature of the cold trap 2300, and the warpage of the substrate or the amount of generated miscellaneous crystals. In FIG. 20, the horizontal axis represents the temperature of cold trap, and the vertical axis represents the curvature of the substrate (i.e., the extent of warpage of the substrate) (1/radius of curvature (m)) and the weight of generated miscellaneous crystals (g). As shown in FIG. 20, the higher the temperature of the cold trap 2300, the greater the warpage of the substrate. Also, the higher the temperature of the cold trap 2300, the smaller the weight of generated miscellaneous crystals. That is, the higher the temperature of the cold trap 2300, the smaller the amount of removed impurities. In this case, the purity of Na decreases, and the oxygen content increases. From the viewpoint of preventing warpage, the temperature of the cold trap 2300 is preferably lower. From the viewpoint of reducing the amount of generated miscellaneous crystals, the temperature of the cold trap 2300 is preferably higher. In other words, from the viewpoint of preventing warpage, the purity of Na is preferably higher (i.e., lower oxygen content), and, from the viewpoint of suppressing generation of miscellaneous crystals, the purity of Na is preferably lower (i.e., higher oxygen content). Thus, suppression of warpage and suppression of generation of miscellaneous crystals are in a trade-off relation.

When the temperature of the cold trap 2300 is 120° C. to 300° C. (range R1 in FIG. 20), at least one of the warpage of semiconductor and the amount of generated miscellaneous crystals is suppressed. In the range R1, the curvature is about 0.4/m or less, and the amount of generated miscellaneous crystals is about 8 g or smaller. When the temperature of the cold trap 2300 is 120° C. to 230° C. (range R2 in FIG. 20), the curvature is about 0.3/m or less. Thus, the warpage of semiconductor is suppressed. When the temperature of the cold trap 2300 is 180° C. to 300° C. (range R3 in FIG. 20), the amount of generated miscellaneous crystals is about 2 g or smaller. Thus, the amount of generated miscellaneous crystals is suppressed. When the temperature of the cold trap 2300 is 180° C. to 230° C. (range R4 in FIG. 20), the curvature is 0.3/m or less, and the amount of generated miscellaneous crystals is 2 g or smaller. Thus, the warpage and the amount of generated miscellaneous crystals are suppressed. The merits of suppression of the warpage of the substrate after growth of the GaN semiconductor and the generation of miscellaneous crystals are described in relation to the second embodiment.

In the Na purity control step, the temperature of the cold trap 2300 may be adjusted to 300° C. or thereabouts. In this case, oxygen present in the environment around the Na circulation apparatus 2000 readily enters the cold trap 2300, and the intake oxygen migrates into the molten Na. As a result, the oxygen concentration of Na increases. As described above, in the Na purity control step, the oxygen concentration of Na for use in the growth can be appropriately regulated by controlling the temperature of the cold trap 2300.

Features Generally Applicable to all Embodiments
1. Use of Multi-Point Seed (MPS) Substrate FIGS. 21A and 21B are a cross-section and a plan view of an MPS substrate. On the sapphire substrate 11, a patterned SiO$_2$ dielectric mask is formed. Patterning is performed through photolithography. On the mask, a buffer layer 12 and a GaN single crystal layer are sequentially grown. A GaN single crystal is grown on a part not covered with the mask. After that, the mask is removed. As shown in FIG. 21A, posts 13A having a hexagonal pyramid shape are formed. FIG. 21B is a top view of these posts which are arranged into a triangular grid. The arrangement corresponds to a honeycomb structure.

In the aforementioned first to third embodiments, the above-mentioned MPS substrate may be used, and GaN may be grown on the substrate through the flux method. A mechanism for moving up and down the seed substrate is provided in the furnace. In a specific case, an MPS substrate is firstly immersed in molten Na—Ga, and GaN is grown around the posts 13A. More specifically, GaN is grown on each hexagonal pyramid having a (10-11) plane (i.e., S-plane) as a facet plane. The step is a first growth step. In the first growth step, the growth spontaneously stops in a specific stage without filling the space between posts 13A with GaN. Subsequently, the MPS substrate was repeatedly subjected to many repetitions of up-and-down operations (i.e., immersion in and pulling from the molten Na—Ga), to thereby grow GaN in the space where no post is present. The facet plane was a (10-11) plane in the region near the underlayer substrate 11 (i.e., a lower region), and a (10-12) plane in the region far from the underlayer substrate 11 (i.e., an upper region) (r-plane). This step is a second growth step. The second growth step is called a "flux film coat (FFC)." When the second step is complete, the space between posts was filled with grown GaN. After completion of the second growth step, the MPS substrate is immersed in molten Na—Ga for a specific period of time, whereby GaN is grown along the c-axis direction. This step is a third growth step. In the third growth step, the top surface is flattened and assumed the c-plane of GaN.

After the growth of a c-plane GaN layer having a specific thickness from the MPS substrate, the furnace is cooled. When the GaN-formed substrate is removed from the furnace, the grown GaN layer is readily peeled from the underlayer substrate 11. The peeling surface of the GaN layer is polished. And also the growth surface of the GaN on which a semiconductor layer will be formed. The thus-polished GaN is used as a substrate for providing a variety of devices. For example, a thick GaN layer can be further formed thereon through HVPE for high-speed growth. Such a thick GaN layer may be used as a substrate for a device such as a field-effect transistor or a light-emitting device.

Figure 22A:
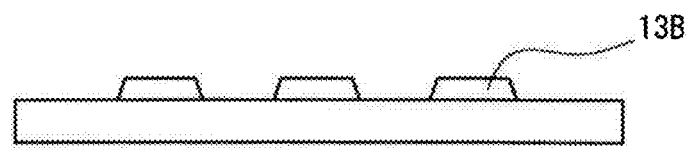
FIG. 22A is a cross-section of another example of the seed substrate.
Figure 22B:
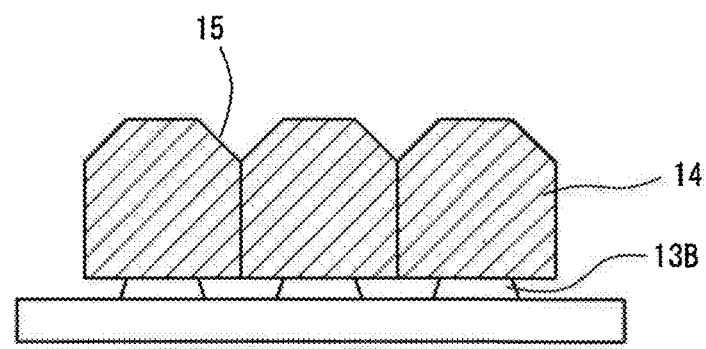
FIG. 22B is a cross-section of a semiconductor grown on the seed substrate.
Figure 22C:
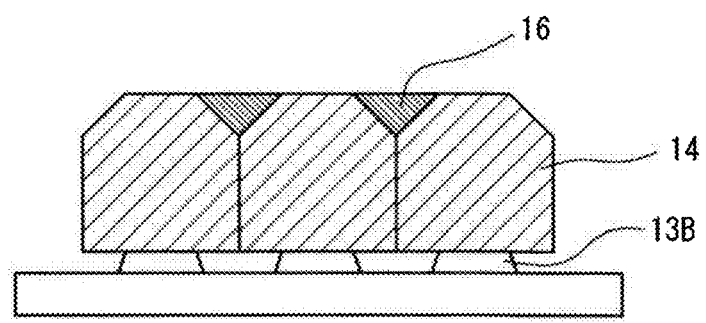
FIG. 22C is a cross-section of another example of the seed substrate following FIG. 22B.
Figure 22D:
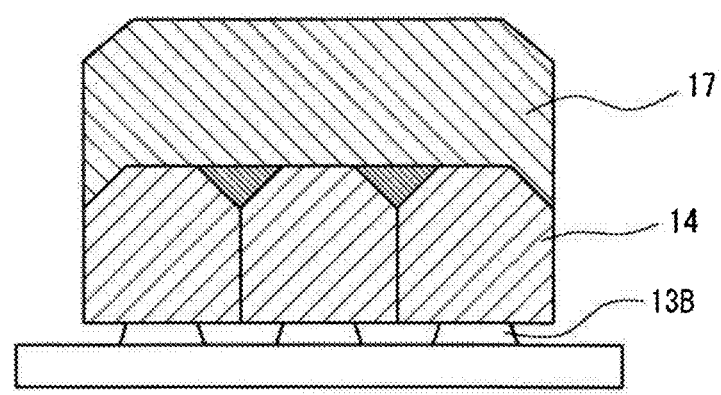
FIG. 22D is a cross-section of another example of the seed substrate following FIG. 22C.

A MPS substrate having a shape as shown in FIG. 22A may be used. Each of the posts 13B may be formed in a hexagonal column or a hexagonal pyramid. These posts are arranged into a triangular grid as shown in the plan view of FIG. 21B. The arrangement corresponds to a honeycomb structure. In this case, GaN 14 was grown on flat top surfaces of the posts 13B for 40 hours as the first growth step (FIG. 22B). Subsequently, as the second growth step was performed for 80 hours. In this case, the space (groove) 15 between posts was filled by growing GaN (FFC) on a facet plane of the groove 15 at the junction of GaN 14 grown in the first growth step (FIG. 22C). Then, as the third growth step, GaN 17 was uniformly grown along the c-axis direction (FIG. 22D).

Example 4

An MPS substrate (diameter: 6 inches) was used. The preparation was performed in a glovebox under Ar in which the oxygen concentration and water content were controlled to low levels. More specifically, the oxygen concentration was controlled to be lower than 0.05 ppm, and the water content was adjusted such that the dew point of the internal atmosphere was lower than −90° C. In purification of Na, the cold trap 2300 shown in FIG. 9 was adjusted to 180° C. When the purity reached a target value through circulation of molten Na, the molten Na was removed from the system and solidified. A weighed aliquot thereof was placed into a crucible. Then, Ga and carbon were added to the crucible. The Ga/Na ratio was 18 mol %, and the ratio of carbon to Na was 0.6 mol %. An MPS substrate or an MPS substrate held by a supporting member was added to the crucible containing the raw materials, and the crucible was transferred into a growth furnace. The furnace was evacuated to 0.2 Pa, and then nitrogen was fed into the furnace so as to adjust the internal pressure to 3.0 MPa.

Subsequently, the furnace was heated to 870° C. (i.e., GaN growth temperature), and the MPS substrate was immersed in molten Na—Ga at the timing of 20 hours passing after the temperature reaching 870° C. The FFC growth of GaN was performed at the timing of 40 hours passing after the MPS substrate was immersed in molten Na—Ga. The growth of GaN through a flux method is performed for 220 hours in total. Specifically, the first growth step was performed for 40 hours, the second growth step for 80 hours, and the third growth step for 60 hours. Through the first to third steps, the growth temperature and pressure were constantly set to 870° C. and 3.0 MPa. According to the above growth technique, a c-plane GaN semiconductor having a diameter of 6 inches was yielded. At this time, generation of miscellaneous crystals and occurrence of warpage of the semiconductor can be suppressed by controlling the oxygen concentration in the molten liquid of Na in the same way as in Examples 1 to 3.

In Example 4, alternatively, highly purified molten Na may be directly fed to a crucible in a manner similar to that of the third embodiment, and Ga, C, and MPS SUBSTRATE may be added thereto, to thereby conduct crystal growth.

2. Reuse as Seed Substrate

The Group III nitride semiconductor which has been produced in the semiconductor growth may also be used as a seed substrate. In such a case, the semiconductor grown through the flux method is separated from the growth substrate, to thereby provide a new semiconductor substrate.

The new substrate can be employed as a seed substrate for use in the flux method. On the semiconductor substrate, a thick Group III nitride semiconductor may be grown through HYPE, to thereby prepare a thick film substrate. By using a seed substrate having small off-angle distribution, dislocation density or warpage, a thick semiconductor substrate exhibiting better quality as compared to conventional substrate can be provided.

3. Diversion to Device Substrate

Through forming device layers on the thus-produced semiconductor substrate through MOCVD, various devices such as an LED and a field-effect transistor can be fabricated. Alternatively, GaN is grown at high speed through HVPE on the GaN layer obtained through the aforementioned flux method, to thereby form a thick GaN layer, and device layers are grown through MOCVD on the thick GaN layer, to thereby produce corresponding devices. In this case, the produced devices are attached to an underlayer substrate. Alternatively, the thick GaN layer may be sufficiently grown, and the underlayer substrate is removed, whereby a substrate-free device is produced.

What is claimed is:

1. A method for producing a Group III nitride semiconductor, the method comprising:
    substituting an internal atmosphere of a furnace by a nitrogen gas, the furnace including a reaction chamber;
    heating the furnace;
    evacuating the furnace to reduce an oxygen concentration of the furnace to 0.02 ppm or less;
    installing a crucible in the reaction chamber, the crucible including a seed substrate, a solid Na, and a solid Ga;
    feeding a nitrogen-containing gas to the furnace and adjusting an internal pressure of the furnace to a growth pressure, the oxygen concentration of the furnace internal atmosphere being controlled at any initial value in a range of 0.02 ppm or less at the growth pressure;
    heating the furnace to a growth initiation temperature of the Group III nitride semiconductor;
    controlling the oxygen concentration of the furnace internal atmosphere in a range of 0.02 ppm or less in an initial stage of crystal growth after the growth initiation temperature is realized;
    increasing and controlling the oxygen concentration of the furnace internal atmosphere to any value greater than 0.02 ppm and 0.1 ppm or less during a growth period after the initial stage of crystal growth elapses; and
    obtaining the Group III nitride semiconductor with no anomalous growth at a periphery of the seed substrate.

2. The Group III nitride semiconductor production method according to claim 1, wherein the oxygen concentration of the furnace internal atmosphere is increased from the initial value in accordance with progress of growing of the Group III nitride semiconductor.

3. The Group III nitride semiconductor production method according to claim 1, wherein the initial stage of crystal growth is adjusted to 5 hours to 15 hours.

4. The Group III nitride semiconductor production method according to claim 1, wherein the oxygen concentration of the furnace internal atmosphere is controlled by the oxygen concentration of the nitrogen-containing gas which is fed to the molten mixture.

5. The Group III nitride semiconductor production method according to claim 1, wherein the oxygen concentration of the furnace internal atmosphere is regulated by the oxygen concentration of a furnace external atmosphere.

* * * * *